(12) United States Patent
Lee et al.

(10) Patent No.: US 11,948,981 B2
(45) Date of Patent: Apr. 2, 2024

(54) SEAM-FILLING OF METAL GATES WITH SI-CONTAINING LAYERS

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 62 days.

(21) Appl. No.: 17/405,406

(22) Filed: Aug. 18, 2021

(65) Prior Publication Data
US 2023/0014471 A1    Jan. 19, 2023

Related U.S. Application Data

(60) Provisional application No. 63/222,013, filed on Jul. 15, 2021.

(51) Int. Cl.
| H01L 21/00 | (2006.01) |
| H01L 21/28 | (2006.01) |
| H01L 21/8234 | (2006.01) |
| H01L 27/088 | (2006.01) |
| H01L 29/06 | (2006.01) |

(Continued)

(52) U.S. Cl.
CPC ...... *H01L 29/401* (2013.01); *H01L 21/28035* (2013.01); *H01L 21/28088* (2013.01); *H01L 21/823437* (2013.01); *H01L 21/823462* (2013.01); *H01L 21/823475* (2013.01); *H01L 27/088* (2013.01); *H01L 29/0665* (2013.01); *H01L 29/42392* (2013.01); *H01L 29/66545* (2013.01); *H01L 29/66742* (2013.01); *H01L 29/78645* (2013.01)

(58) Field of Classification Search
CPC ....... H01L 21/823437; H01L 21/82345; H01L 29/401; H01L 29/42392; H01L 29/66545
See application file for complete search history.

(56) References Cited

U.S. PATENT DOCUMENTS

| 10,461,167 B2 | 10/2019 | Lee et al. |
| 11,387,346 B2 | 7/2022 | Huang et al. |

(Continued)

FOREIGN PATENT DOCUMENTS

| CN | 113113361 A | 7/2021 |
| KR | 20190000965 A | 1/2019 |

*Primary Examiner* — Reema Patel
(74) *Attorney, Agent, or Firm* — Slater Matsil, LLP

(57) ABSTRACT

A method includes forming a dummy gate stack over a semiconductor region, forming epitaxial source/drain regions on opposite sides of the dummy gate stack, removing the dummy gate stack to form a trench, depositing a gate dielectric layer extending into the trench, and depositing a work-function layer over the gate dielectric layer. The work-function layer comprises a seam therein. A silicon-containing layer is deposited to fill the seam. A planarization process is performed to remove excess portions of the silicon-containing layer, the work-function layer, and the gate dielectric layer. Remaining portions of the silicon-containing layer, the work-function layer, and the gate dielectric layer form a gate stack.

19 Claims, 26 Drawing Sheets

(51) Int. Cl.
  *H01L 29/40*    (2006.01)
  *H01L 29/423*   (2006.01)
  *H01L 29/66*    (2006.01)
  *H01L 29/786*   (2006.01)

(56) References Cited

U.S. PATENT DOCUMENTS

| | | | |
|---|---|---|---|
| 2006/0286729 A1* | 12/2006 | Kavalieros | H01L 29/66636 |
| | | | 257/E29.267 |
| 2012/0217590 A1* | 8/2012 | Babich | H01L 29/4966 |
| | | | 257/410 |
| 2018/0374926 A1* | 12/2018 | Lee | H01L 27/1251 |
| 2019/0304846 A1* | 10/2019 | Lee | H01L 21/32134 |
| 2020/0027967 A1 | 1/2020 | Basker et al. | |
| 2020/0152746 A1* | 5/2020 | Tsau | H01L 29/41725 |
| 2021/0280679 A1 | 9/2021 | Lin et al. | |
| 2021/0336033 A1 | 10/2021 | Huang et al. | |

\* cited by examiner

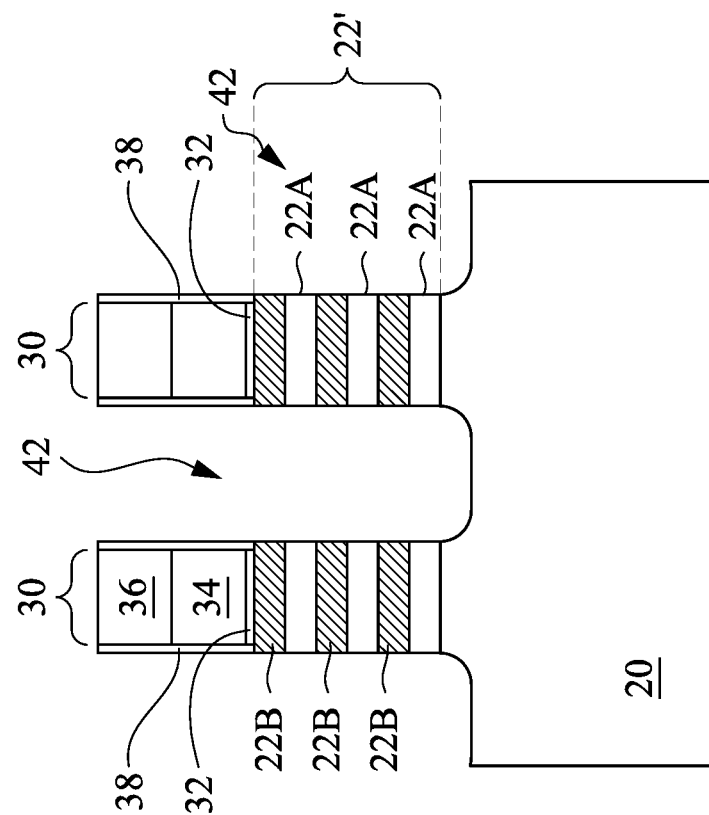
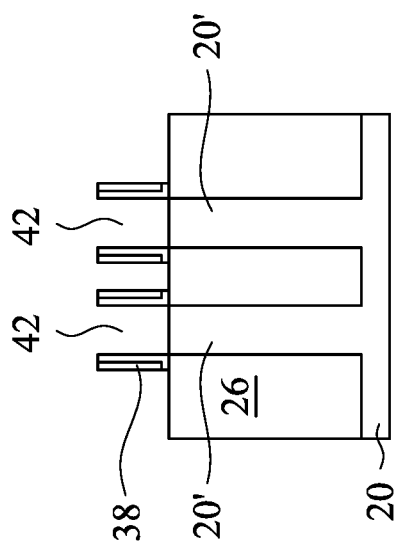
FIG. 6B
FIG. 6A

SEAM-FILLING OF METAL GATES WITH SI-CONTAINING LAYERS

PRIORITY CLAIM AND CROSS-REFERENCE

This application claims the benefit of the following provisionally filed U.S. Patent application: Application No. 63/222,013, filed on Jul. 15, 2021, and entitled "Method of RPG Metal Gap-Fill by Si-Containing Layers and Structure Formed Thereby," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given chip area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14A, 14B, 14C, 15A, 15B, 15C, 15D, 16A, 16B, 17A, 17B, 17C, 17D, 18A, 18B, 18C, 19A, 19B, and 19C illustrate the perspective views, cross-sectional views, and a top view of intermediate stages in the formation of a Gate All-Around (GAA) transistor in accordance with some embodiments.

DETAILED DESCRIPTION

Figure 1:
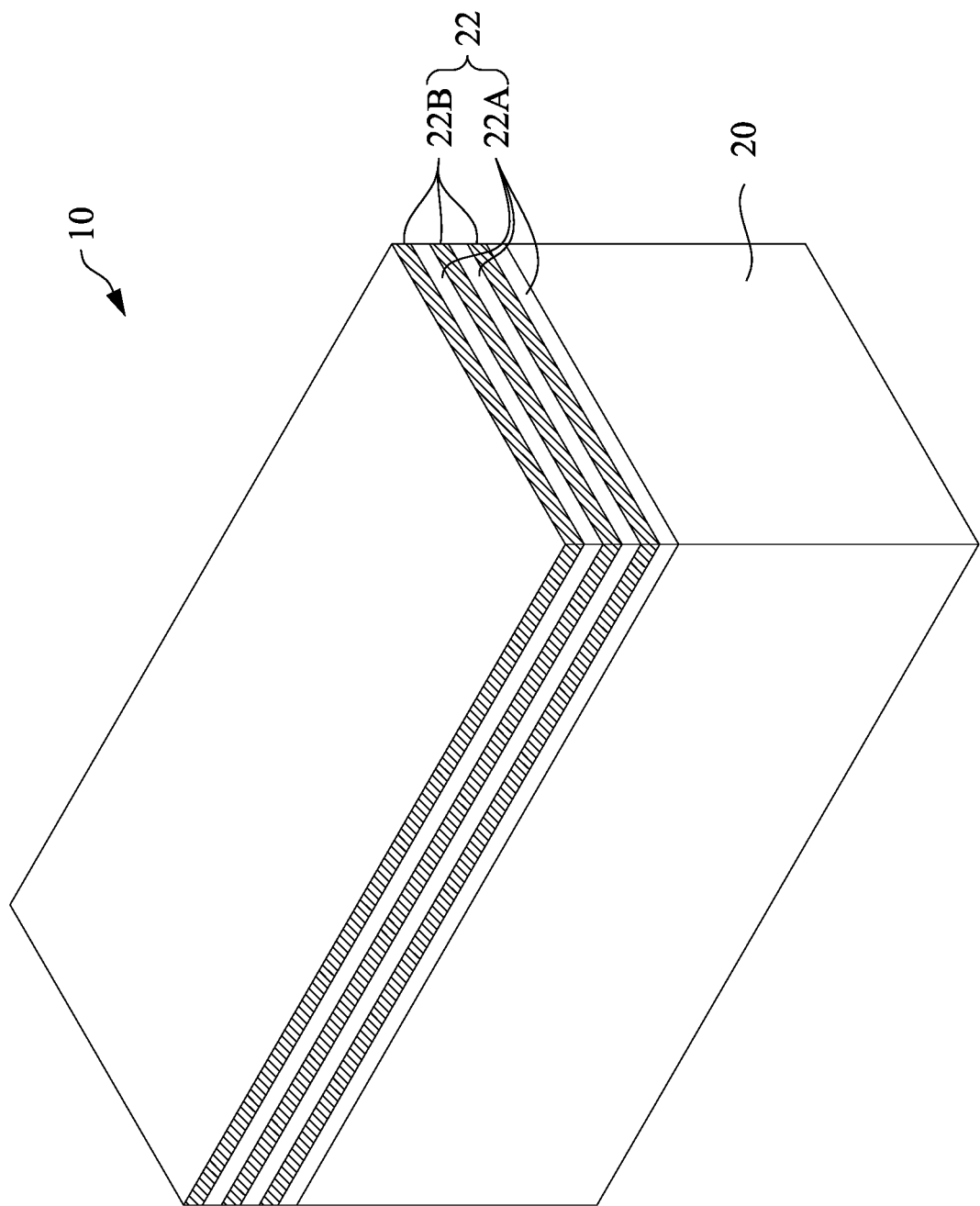

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming a replacement gate stack for a transistor and the structure of the corresponding transistor are provided. In accordance with some embodiments, the replacement gate stack includes work-functional layers formed through conformal deposition methods. A silicon-containing seam-filling layer may be formed, for example, through a soaking process, to fill a seam in the work-function layer. In the description of the present disclosure, a Gate All-Around (GAA) transistor is discussed to explain the concept of the present disclosure. The embodiments of the present disclosure may also be applied to other types of transistors such as Fin Field-Effect Transistors (FinFETs), planar transistors, and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 21:
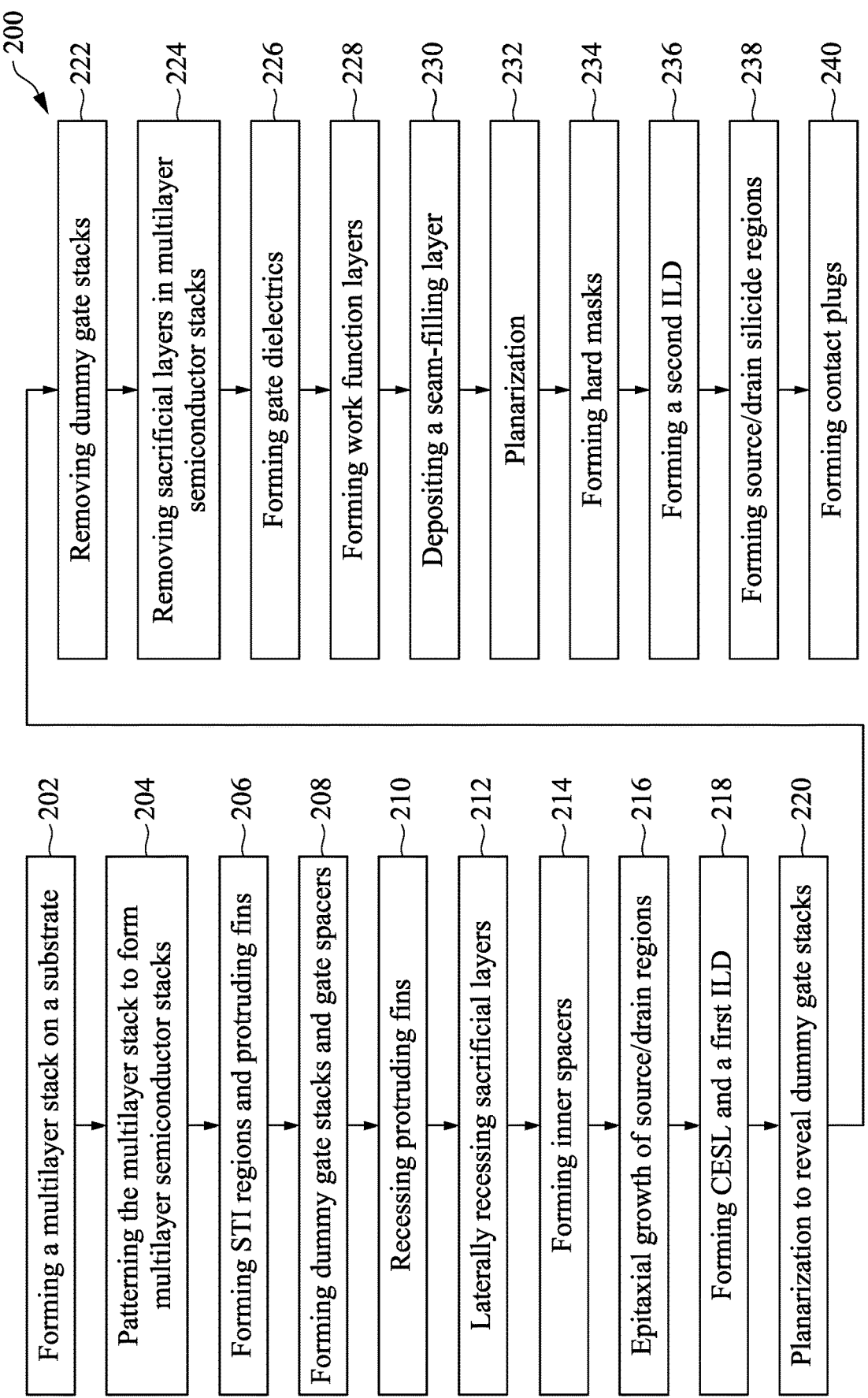
FIG. 21 illustrates a process flow for forming a GAA transistor in accordance with some embodiments.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14A, 14B, 14C, 15A, 15B, 15C, 15D, 16A, 16B, 17A, 17B, 17C, 17D, 18A, 18B, 18C, 19A, 19B, and 19C illustrate various views of intermediate stages in the formation of a GAA transistor in accordance with some embodiments of the present disclosure. The corresponding processes are also reflected schematically in the process flow shown in FIG. 21.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 21. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
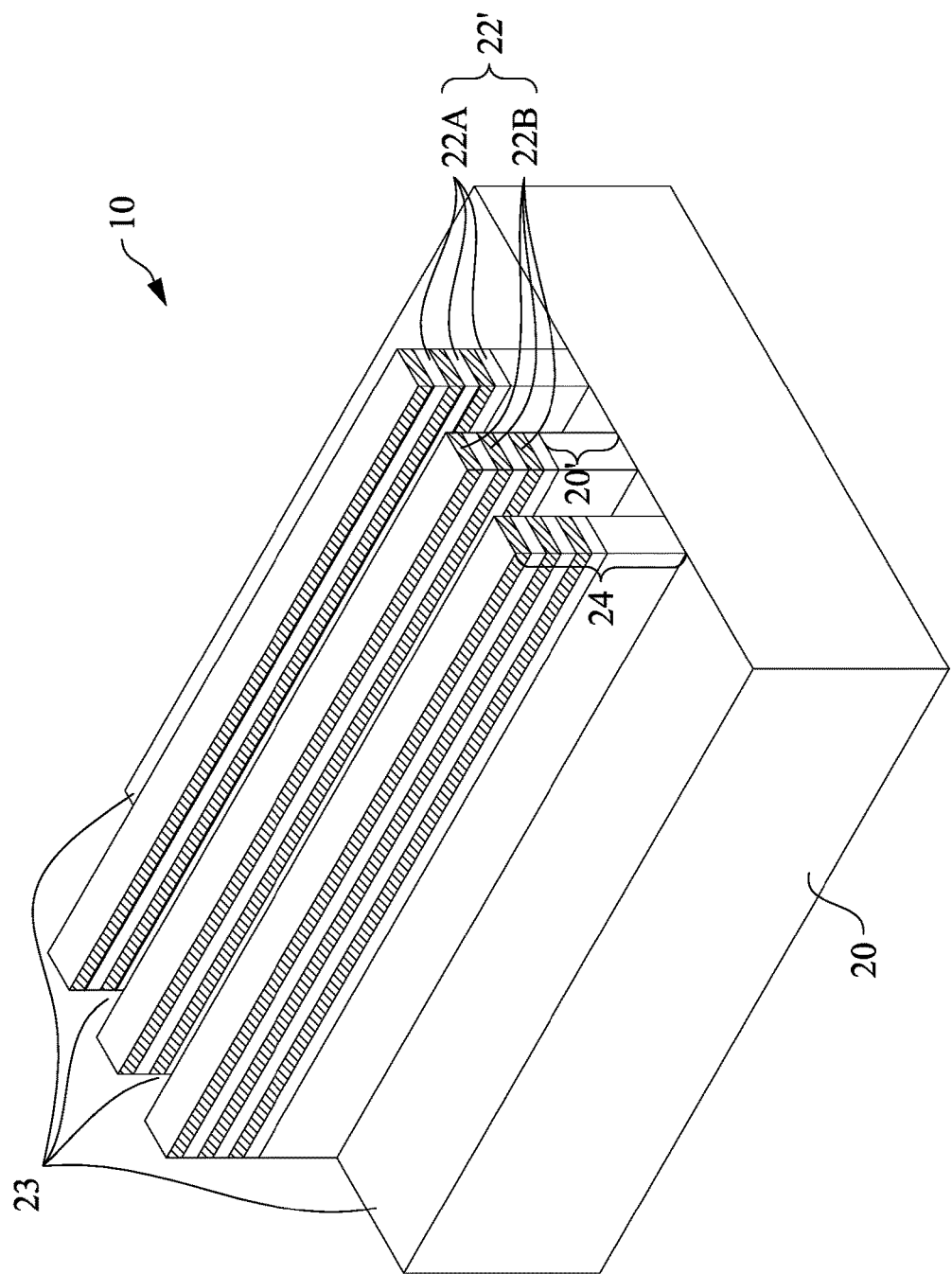

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 21. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
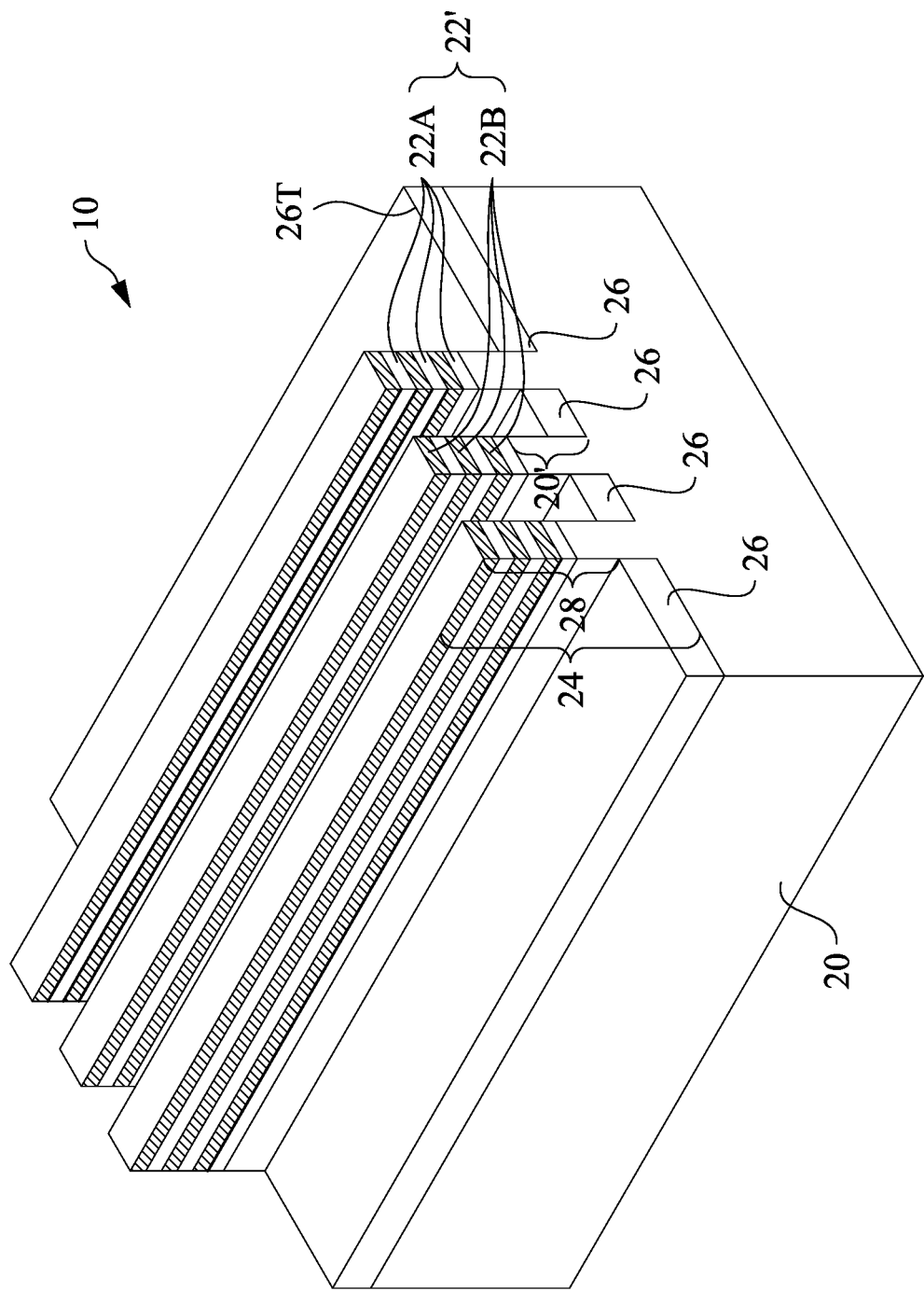

FIG. 3 illustrates the formation of isolation regions 26, which are also referred to as Shallow Trench Isolation (STI) regions throughout the description. The respective process is illustrated as process 206 in the process flow 200 shown in FIG. 21. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
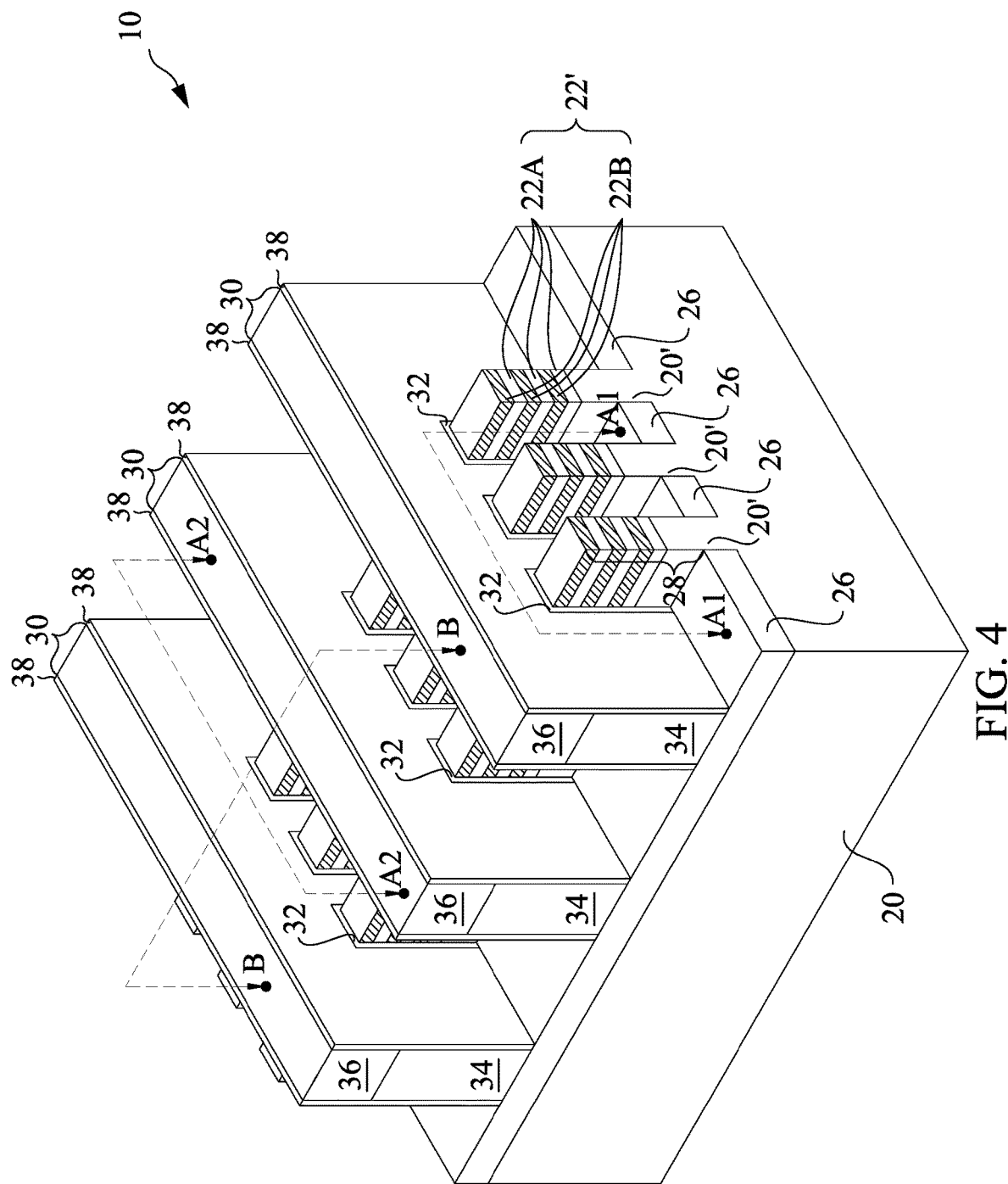

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 21. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5A:
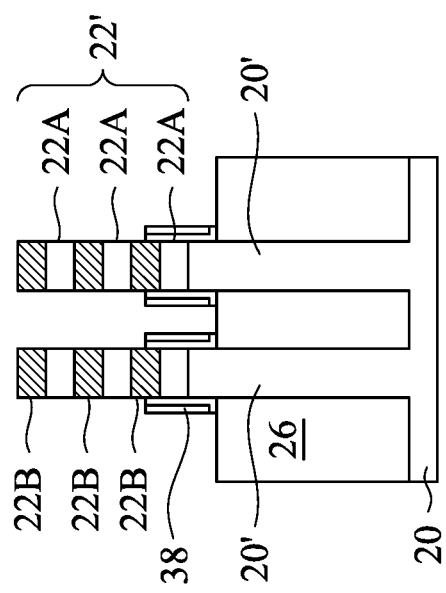
Figure 5B:
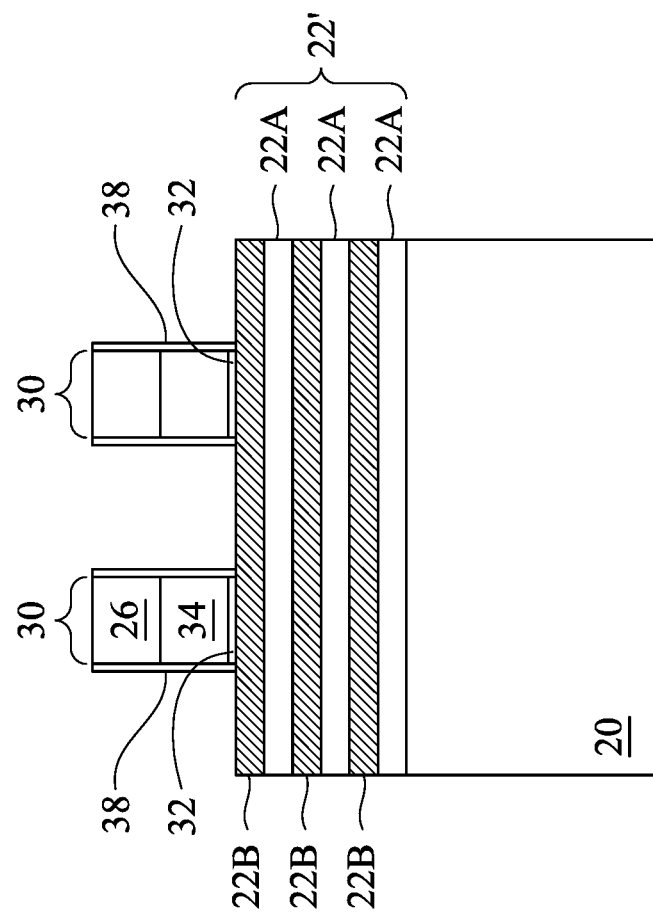

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is perpendicular to the gate-length direction. Gate spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 21. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7A:
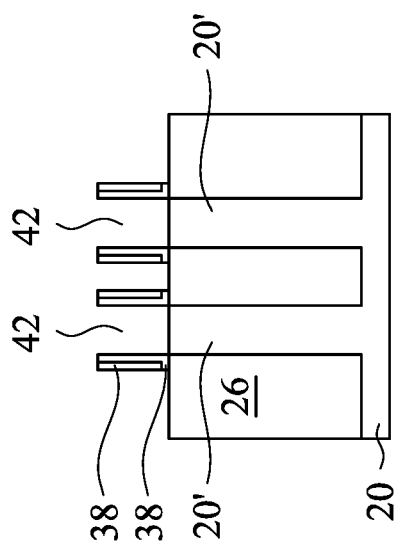
Figure 7B:
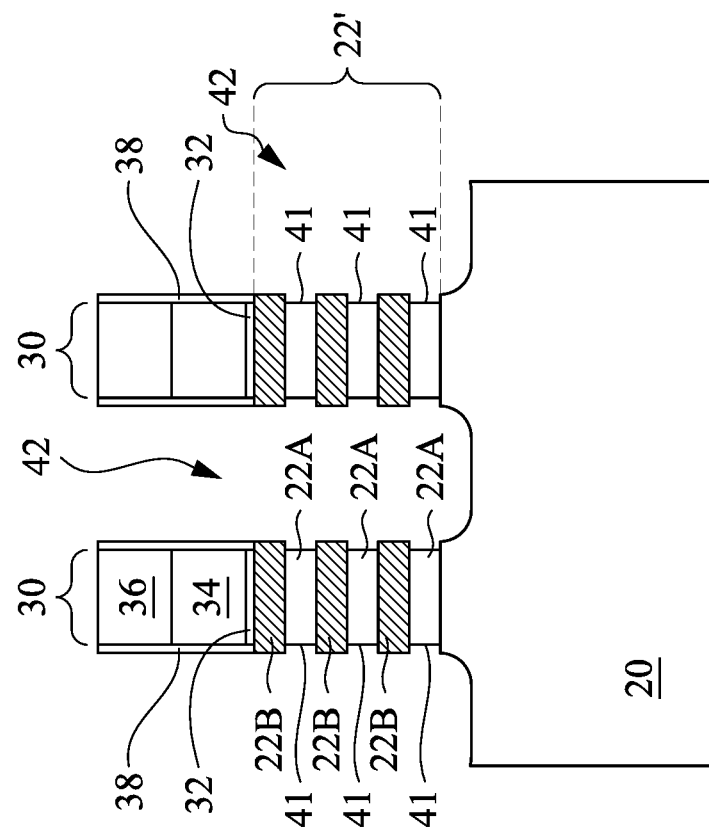

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 21. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
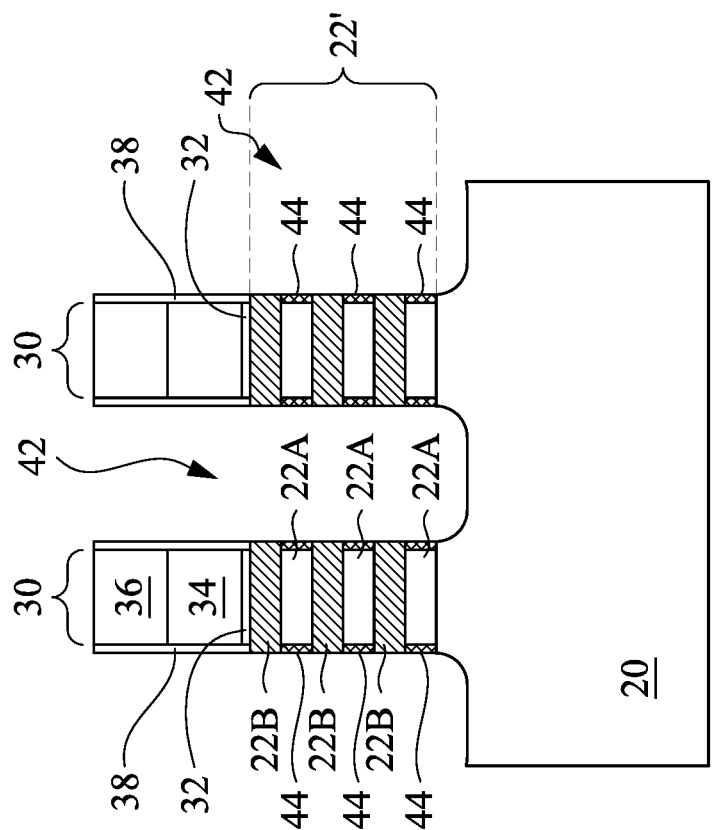
Figure 8A:
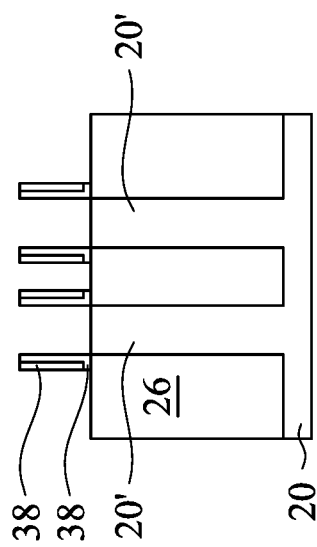

FIGS. 8A and 8B illustrate the formation of inner spacers 44. The respective process is illustrated as process 214 in the process flow 200 shown in FIG. 21. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
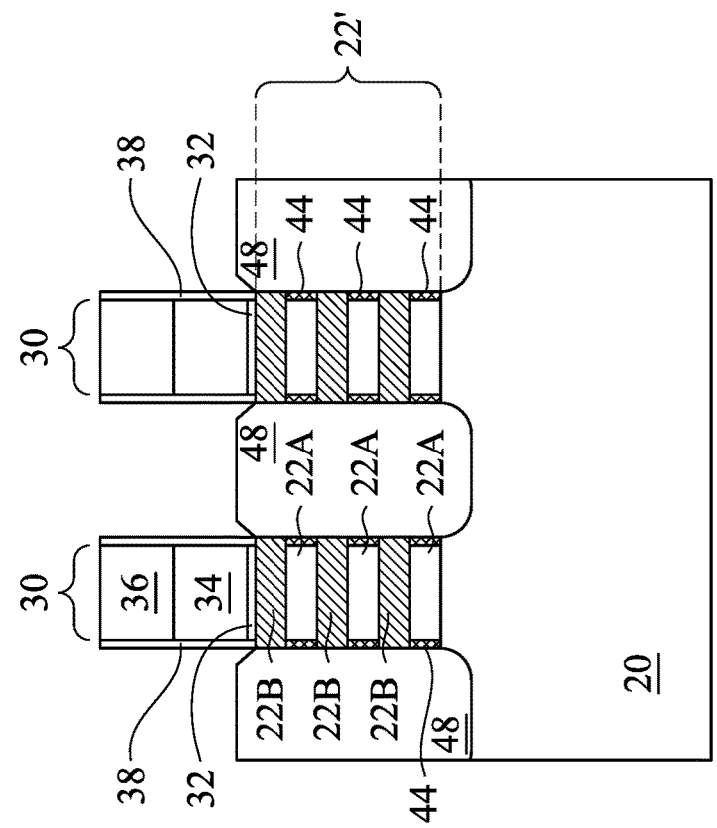
Figure 9A:
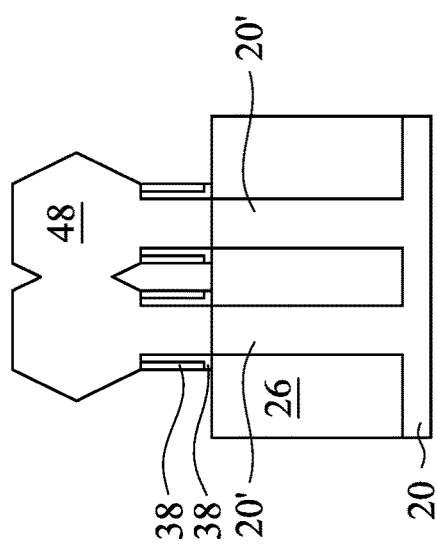

Referring to FIGS. 9A and 9B, epitaxial source/drain regions 48 are formed in recesses 42. The respective process is illustrated as process 216 in the process flow 200 shown in FIG. 21. In accordance with some embodiments, the source/drain regions 48 may exert stress on the nanostructures 22B, which are used as the channels of the corresponding GAA transistors, thereby improving performance. Depending on whether the resulting transistor is a p-type transistor or an n-type transistor, a p-type or an n-type impurity may be in-situ doped with the proceeding of the epitaxy. For example, when the resulting transistor is a p-type transistor, silicon germanium boron (SiGeB), germanium boron (GeB), silicon boron (SiB), or the like may be grown. Conversely, when the resulting transistor is an n-type Transistor, silicon phosphorous (SiP), silicon carbon phosphorous (SiCP), or the like may be grown. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other.

After the epitaxy process, epitaxy regions 48 may be further implanted with a p-type or an n-type impurity to form source and drain regions, which are also denoted using reference numeral 48. In accordance with alternative embodiments of the present disclosure, the implantation process is skipped when epitaxy regions 48 are in-situ doped with the p-type or n-type impurity during the epitaxy, and the epitaxy regions 48 are also source/drain regions.

The subsequent figure numbers in FIGS. 10A, 10B, and 10C through FIGS. 19A, 19B, and 19C may have the corresponding numbers followed by letter A, B, or C. The letter A indicates that the corresponding figure shows a reference cross-section same as the reference cross-section A2-A2 in FIG. 4, the letter B indicates that the corresponding figure shows a reference cross-section same as the reference cross-section B-B in FIG. 4, and letter C indicates the corresponding figure (except FIGS. 15C and 17C) shows a reference cross-section same as the reference cross-section A1-A1 in FIG. 4.

Figure 10A:
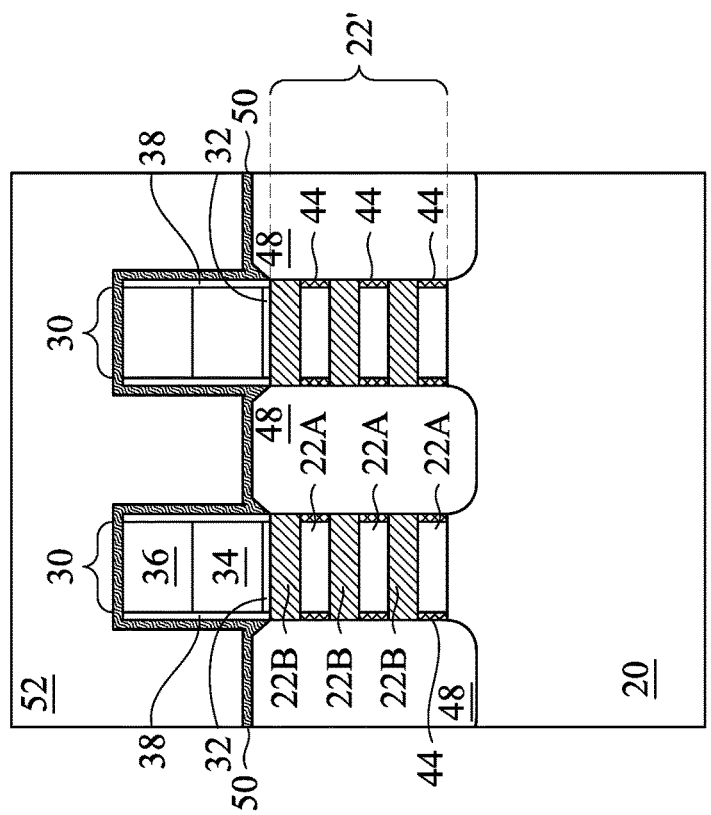
Figure 10B:
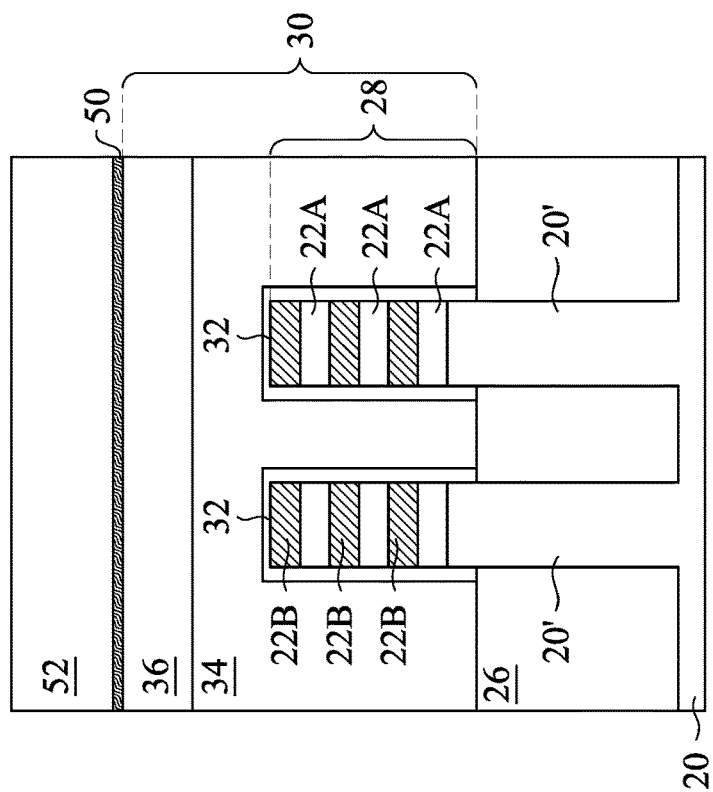
Figure 10C:
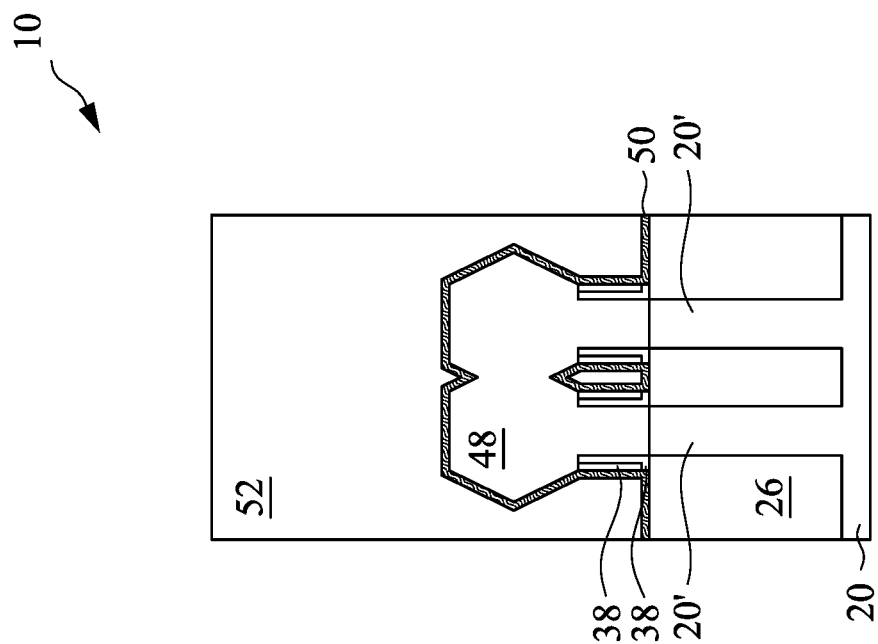

FIGS. 10A, 10B, and 10C illustrate the cross-sectional views of the structure after the formation of Contact Etch Stop Layer (CESL) 50 and Inter-Layer Dielectric (ILD) 52. The respective process is illustrated as process 218 in the process flow 200 shown in FIG. 21. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figures 11A, 11B:
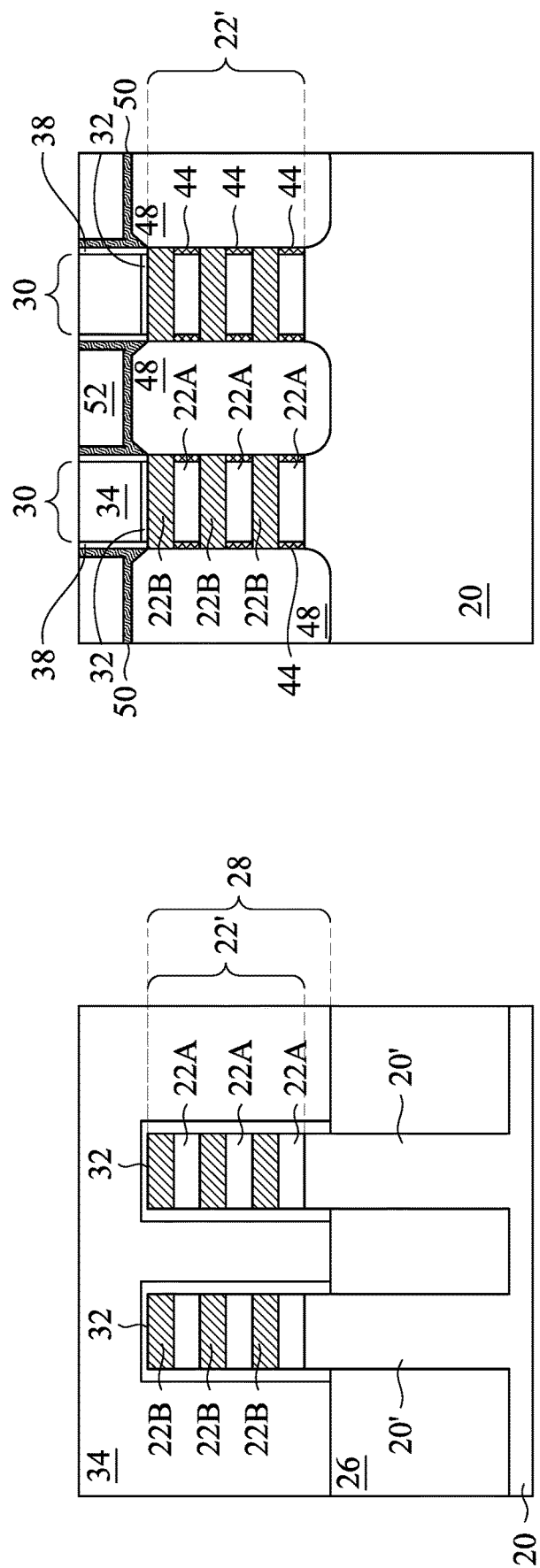

FIGS. 11A and 11B through FIGS. 17A, 17B, 17C, and 17D illustrate the process for forming replacement gate stacks. In FIGS. 11A and 11B, a planarization process such as a CMP process or a mechanical grinding process is performed to level the top surface of ILD 52. The respective process is illustrated as process 220 in the process flow 200 shown in FIG. 21. In accordance with some embodiments, the planarization process may remove hard masks 36 to reveal dummy gate electrodes 34, as shown in FIG. 11A. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level within process variations.

Figure 12B:
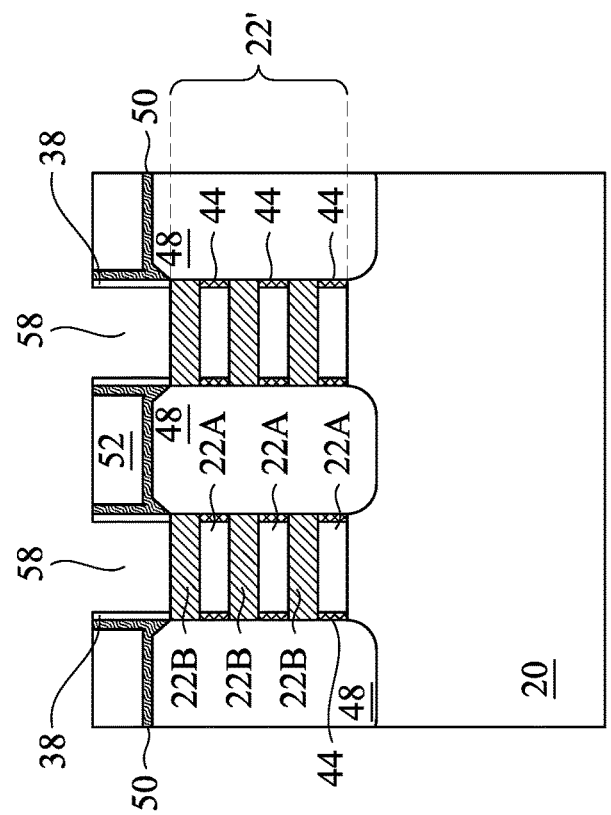
Figure 12A:
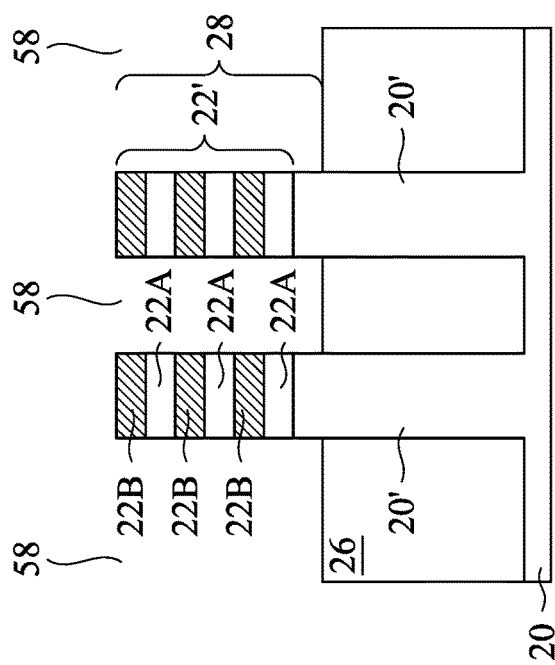

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 shown in FIG. 21. The portions of the dummy gate dielectrics 32 in recesses 58 are also removed. In accordance with some embodiments, dummy gate electrodes 34 and dummy gate dielectrics 32 are removed through a dry etch process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22', are between neighboring pairs of the epitaxial source/drain regions 48.

Figure 13B:
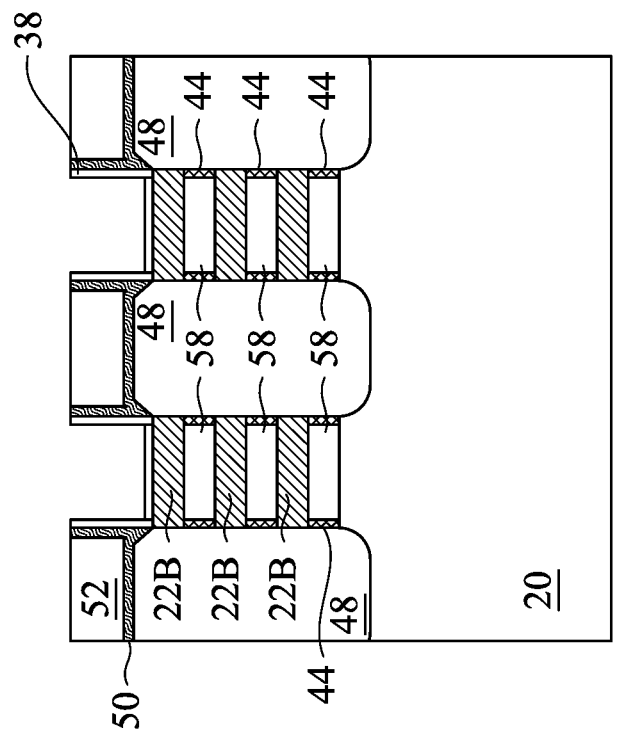
Figure 13A:
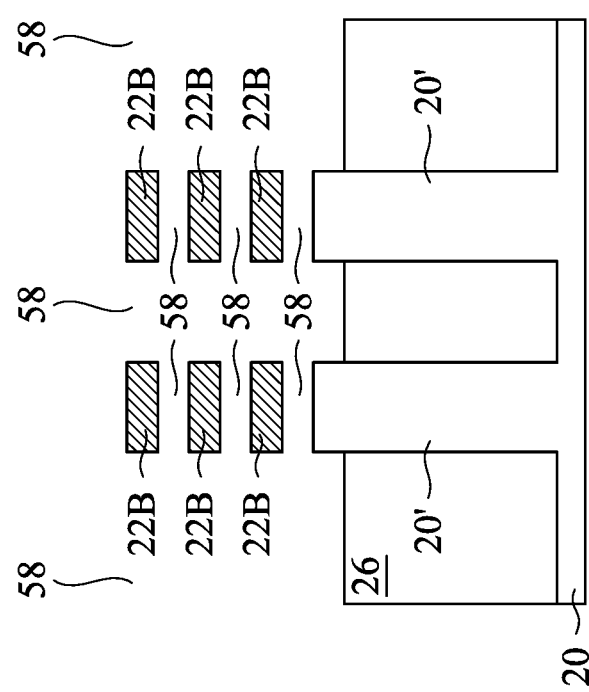

Sacrificial layers 22A are then removed to extend recesses 58 between nanostructures 22B, and the resulting structure is shown in FIGS. 13A and 13B. The respective process is illustrated as process 224 in the process flow 200 shown in FIG. 21. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide (NH$_4$OH), or the like may be used to remove sacrificial layers 22A.

Figure 14B:
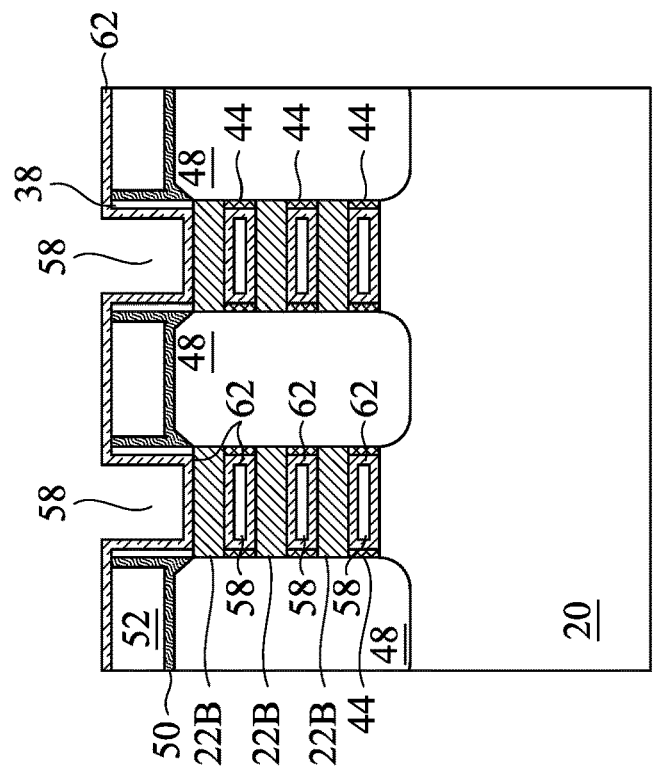
Figure 14C:
Figure 14A:
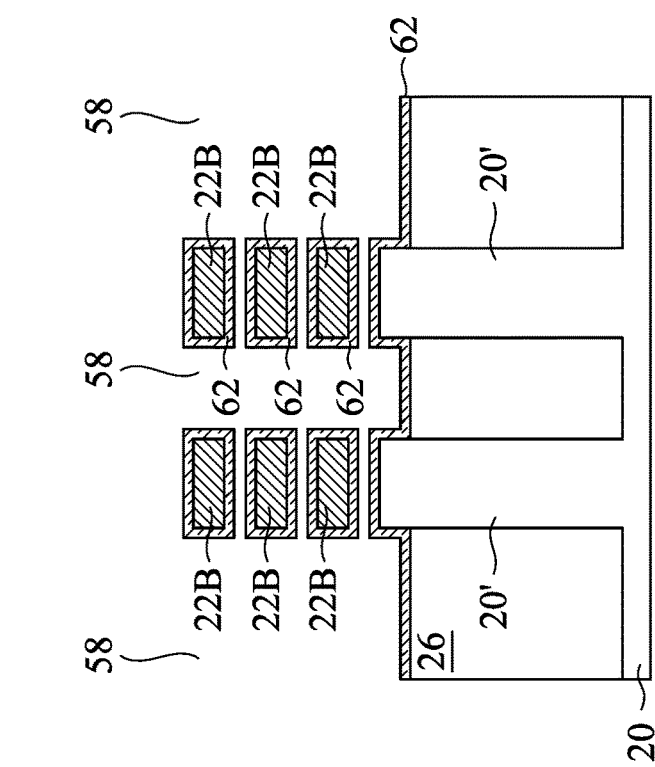

Referring to FIGS. 14A and 14B, and FIG. 14C, gate dielectrics 62 are formed. The respective process is illustrated as process 226 in the process flow 200 shown in FIG. 21. An example of a gate dielectric 62 is shown in FIG. 14C. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with some embodiments, the high-k dielectric layers 62B comprise one or more dielectric layers. For example, the high-k dielectric layers 62B may include a metal oxide or a silicate of hafnium, aluminum, zirconium, lanthanum, manganese, barium, titanium, lead, or combinations thereof. High-k dielectric layers 62B may also be formed through a conformal deposition process.

Figure 15B:
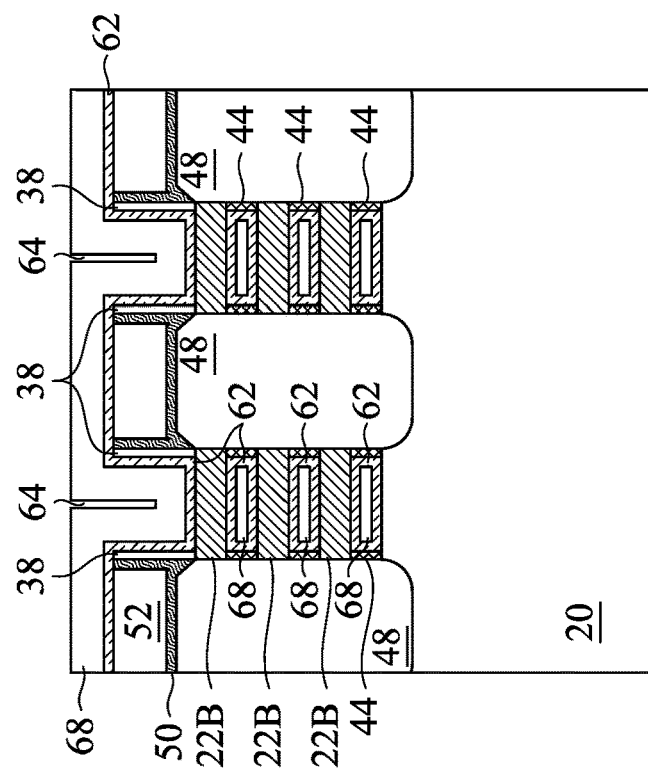
Figure 15A:
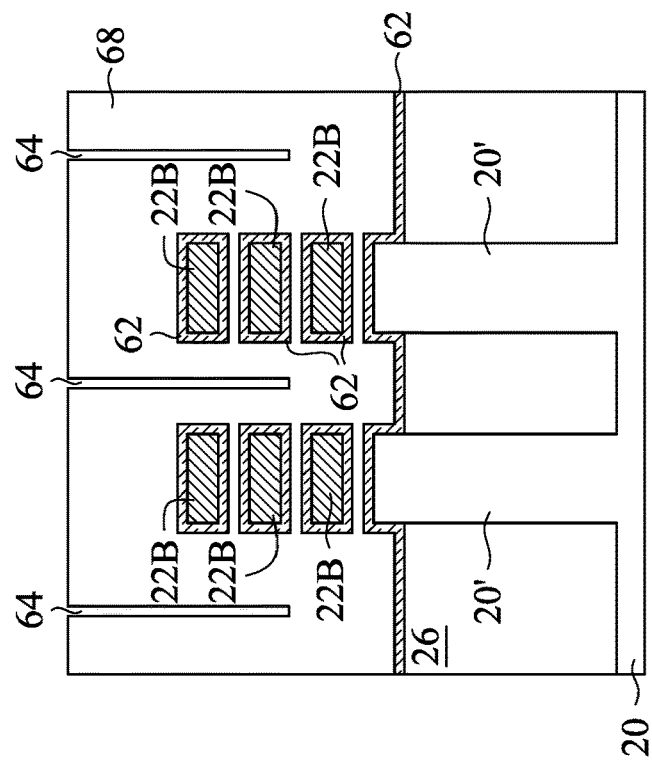

Referring to FIGS. 15A and 15B, work-function layer 68 is formed. The respective process is illustrated as process 228 in the process flow 200 shown in FIG. 21. In the formation, conductive layers are first deposited on the high-k dielectric layer 62B and filling recesses 58. Work-function layer 68 may include a metal-containing material such as TiN, TaN, TiAl, TiAlC, combinations thereof, and/or multilayers thereof. For example, although the details of work-function layer 68 are not illustrated in FIGS. 16A and 16B, work-function layer 68 may comprise any number of layers. For example, when the corresponding transistor is a p-type transistors, work function layers 68 may have a high work function suitable for forming PMOS devices, which work function may be between about 4.9 eV and about 5.2 eV, and may be close to, or equal to, the band-edge work function of about 5.2 eV. For example, work-function layer 68 may include a TiN layer.

When the corresponding transistor is an n-type transistor, work function layer 68 may has a low work function suitable for forming NMOS devices, which work function may be between about 4.0 eV and about 4.4 eV, and may be a band-edge work function of about 4.1 eV. For example, work-function layer 68 may include a TiAl-containing layer, a composite layer including a TiN layer and a TiAl-containing layer over the TiN layer, or a composite layer including a TiAl-containing layer and a TiN layer over the TiAl-containing layer. The TiAl-containing layer may include TiAlC, TiAlN, or the like. When work-function layer 68 includes a plurality of layers, the plurality of layers may be in-situ deposited in the same production tool without vacuum break in between. Gate dielectrics 62 and work-function layer 68 also fill the spaces between adjacent ones of nanostructures 22B, and fill the spaces between the bottom ones of nanostructures 22B and the underlying substrate strips 20'.

In accordance with some embodiments, the deposition of work-function layer 68 is performed using an ALD process or a CVD process. When TiN in work-function layer 68 is deposited, the deposition is performed using a Ti-containing precursor and a nitrogen-containing precursor. The Ti-containing precursor may include TiCl$_4$, TiCl$_5$, or the like, or combinations thereof. The nitrogen-containing precursor may include NH$_3$.

When the TiAl-containing layer in work-function layer 68 is deposited, the precursor may include a titanium-containing precursor and an aluminum-containing precursor. The titanium-containing precursor may include TiCl$_4$, TaCl$_5$, or the like. The aluminum-containing precursor may include triethylaluminum (TEA), tritertbutylaluminum (TTBA), Trimethylaluminum (TMA), or the like, or combinations thereof. When ALD is adopted, an ALD cycle may include a sequence of processes including pulsing and purging the titanium-containing precursor, pulsing and purging the nitrogen-containing precursor, pulsing and purging the aluminum-containing precursor, and pulsing and purging the nitrogen-containing precursor.

Figure 15D:
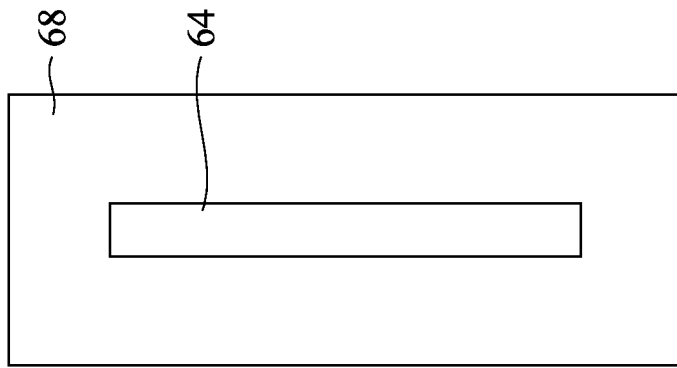
Figure 15C:
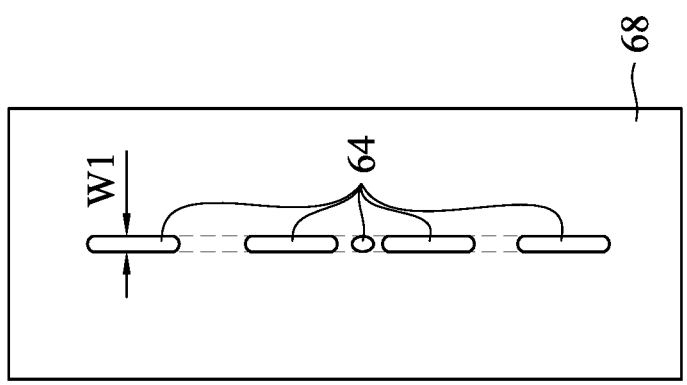

In the formation of work-function layer 68, the opposite portions of work-function layer 68, which opposite portions are deposited on opposite gate spacers 38 (with gate dielectrics 62 in between), grow toward each other, until some parts of the opposite portions join with each other. Seams 64 are formed in work-function layer 68 when the deposition of work-function layer 68 is stopped. It is appreciated that the seams 64 shown in FIGS. 15A, 15B, and 15C are schematic, and the actual shape, positions, and the relative dimensions of seams 64 may be different from what are illustrated. Seams 64 are formed in the middle between the opposite portions of work-function layer 68.

In accordance with some embodiments, the deposition of work-function layer 68 may be stopped when at least some parts of the opposite portions of work-function layer 68 that are deposited on opposite gate spacers 38 merge with each other. In accordance with these embodiments, a silicon soaking process is performed to fill seams 64, as will be discussed in subsequent paragraphs. FIG. 15C illustrates a top view of work-function layer 68, wherein the seams 64 that are visible from top are illustrated using solid lines. The dashed lines represent the portions in which no seams are formed, and the portion that seams 64 are formed, and are sealed by work-function layer 68. Accordingly, these portions of the seams 64 are covered by work-function layer 68, and are not visible from top. The portions of the seams 64 represented with dashed lines may, or may not, interconnect the portions of the seams 64 represented using solid lines. In accordance with some embodiments, the width W1 of seams 64 may be smaller than about 10 Å or smaller than about 5 Å.

In accordance with alternative embodiments, the deposition of work-function layer 68 may be stopped before the opposite portions of work-function layer 68 merge with each other. For example, as shown in FIG. 15D, the resulting seam 64 may be relatively wide, and is elongated and continuous when viewed from top. In accordance with these embodiments, seam 64 may be filled by silicon through silicon soaking, or may also be filled with TiSiN, TaSiN, TiAlSi, WSiCN, or the like, or combinations thereof, as discussed in subsequent paragraphs.

Figure 16B:
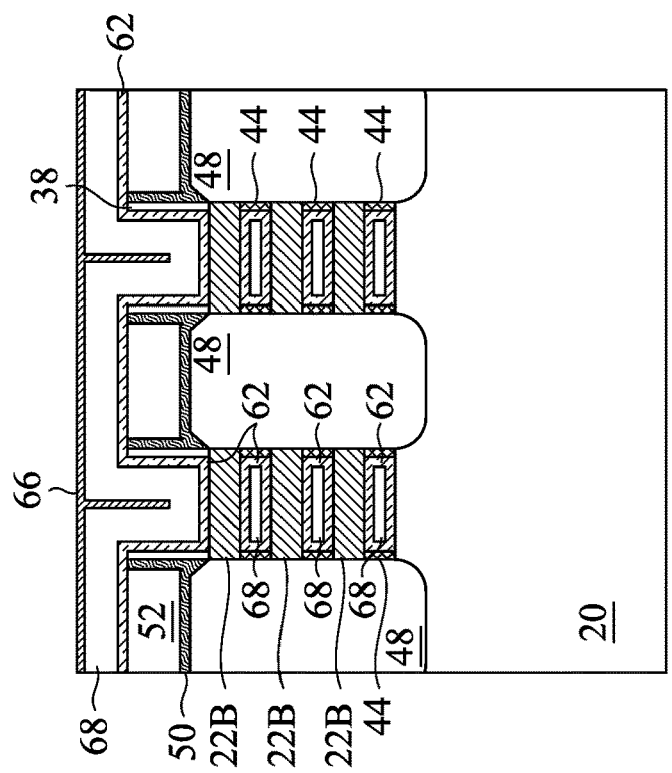
Figure 16A:
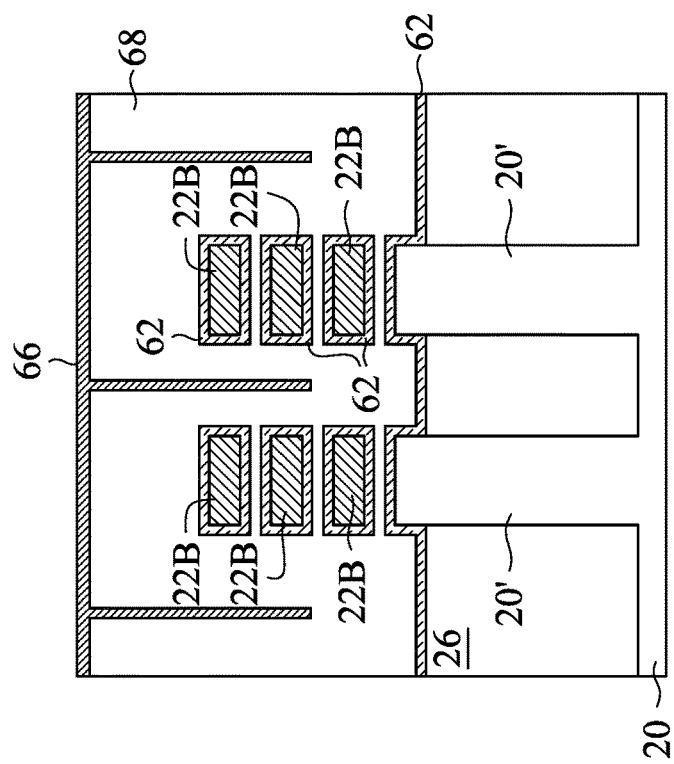

Referring to FIGS. 16A and 16B, seams 64 are filled with a seam-filling layer 66, which is a silicon-containing layer in accordance with some embodiments. The respective process is illustrated as process 230 in the process flow 200 shown in FIG. 21. In the cross-sectional view as shown in FIG. 16B, seam-filling layer 66 extends between opposing portions of work-function layer 68. In accordance with some embodiments, seam-filling layer 66 is a silicon layer including elemental silicon, which is not in the form of a chemical compound. The soaking for forming silicon layer 66 may be performed using a silicon-containing precursor. The silicon-containing precursor may include silane ($SiH_4$), disilane ($Si_2H_6$), trisilane ($Si_3H_8$), dicholorosilane (DCS), or the like, or combinations thereof. In accordance with some embodiments, the soaking temperature of the wafer may be in the range between about 250° C. and about 600° C. There may be some other carrier gases such as argon, or the like. The soaking gas may be free from the compound gases that include Ti, N, Al, and the like. The chamber pressure may be in the range between about 0.5 Torr and about 50 Torr. The soaking time may be in the range between about 2 seconds and about 30 minutes.

In accordance with some embodiments, when seams 64 are narrow, small molecules such as silane are desired to form seam-filling layer 66. Since silane has the molecule size of about 1.98 Å, which is smaller than the molecule size of $TiCl_4$ (3.9 Å), the seam-filling process may be more efficient than seam-filling using $TiCl_4$. When seams 64 are wide, large molecules are also efficient in seam-filling.

The soaking time may be long enough so that no more seam-filling layer 66 is able to fill into seams 64. Alternatively stated, the soaking may be performed until that even if the soaking time is extended, additionally deposited silicon will be deposited into regions higher than the top surface of ILD 52, and hence are outside of and over trenches 58 (FIGS. 14A and 14B). After the soaking process, substantially all (for example, more than 90 volume percent) of the seams 64 may be filled by silicon. There may be, or may not be, remaining small portions of seams 64 unfilled.

In accordance with alternative embodiments, seam-filling layer 66 comprises a silicon-containing compound, which may include TiSiN, TaSiN, TiAlSi, WSiCN, or the like, or combinations thereof. In accordance with some embodiments, seam-filling layer 66 comprises TiSiN, which may be formed through an ALD process. The ALD process may be performed using precursors including $TiCl_4$, $NH_3$, and $SiH_4$, which may be sequentially pulsed into and purged out of the respective chamber, in which wafer 10 is located. In accordance with alternative embodiments in which TaSiN is used, precursors including Pentakis(dimethylamido)tantalum (PDMAT), $NH_3$, and $SiH_4$ may be used. In accordance with yet alternative embodiments in which TiAlSi is used, ALD precursors $TiCl_4$, TEA, and $SiH_4$ may be used. In accordance with yet alternative embodiments in which WSiCN is used, ALD precursors $C_{12}H_{30}N_4W$, TEA, and $SiH_4$ may be used.

Since the silicon-containing compound such as TiSiN, TaSiN, TiAlSi, WSiCN, etc. is amorphous, the silicon-containing compound may be formed in small seams in which TiN cannot fill since TiN may include grains, and hence the locations of TiN is limited. To ensure the formation of the amorphous structure, the wafer temperature for the ALD or CVD process may be low, for example, lower than about 200° C. Accordingly, with the amorphous structure, the silicon-containing compound may fill seams that are left by, and cannot be filled by, TiN. This is combined with the small size of silane molecules to make the filling of small seams 64 more effective.

Figure 17B:
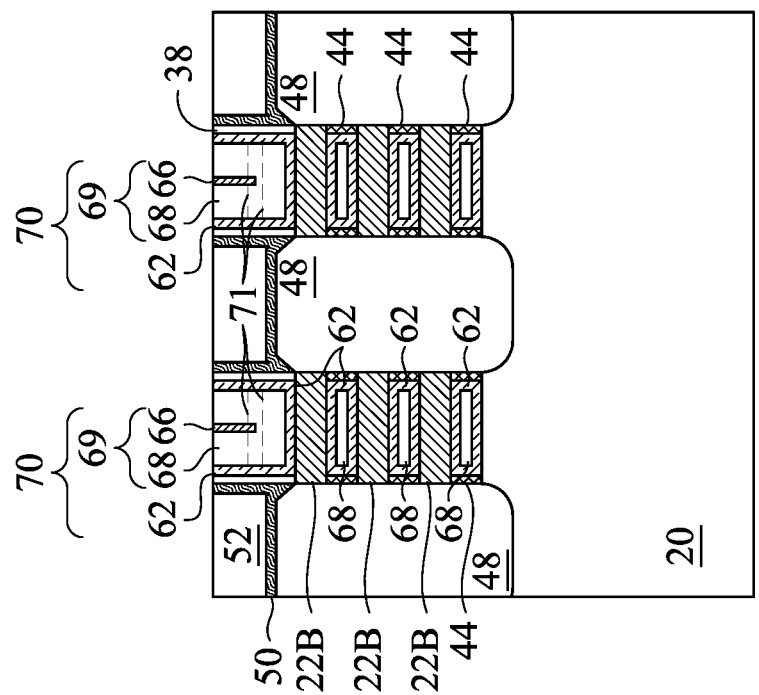
Figure 17A:
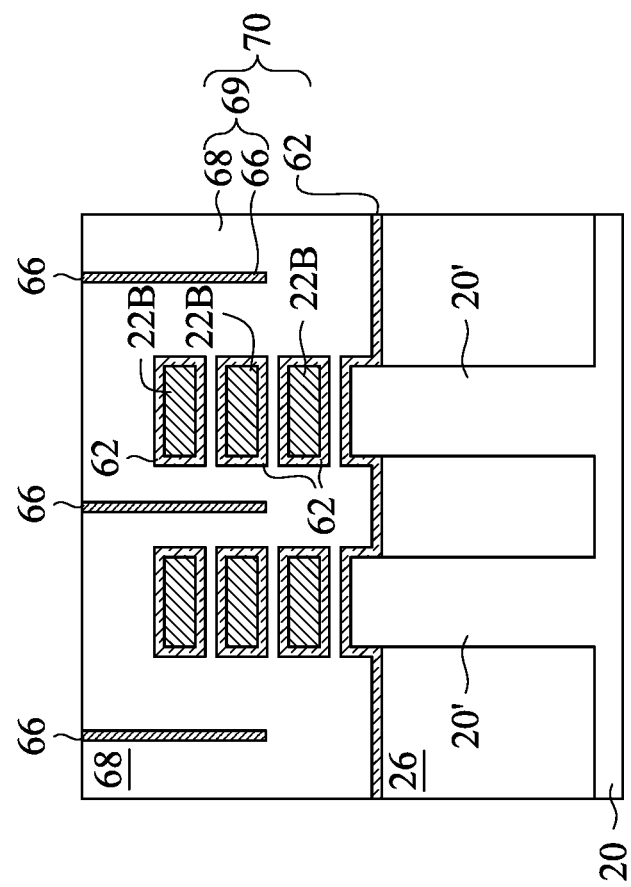

After the filling of recesses 58, a planarization process such as a CMP process or a mechanical grinding process is performed to remove the excess portions of the gate dielectrics 62, work-function layer 68, and seam-filling layer 66, which excess portions are over the top surface of ILD 52. The respective process is illustrated as process 232 in the process flow 200 shown in FIG. 21. The remaining seam-filling layer 66 and work-function layer 68 are collectively referred to as gate electrodes 69. The remaining seam-filling layer 66, work-function layer 68, and gate dielectrics 62 are collectively referred to as gate stacks 70 of the resulting nano-FETs. The resulting structure is shown in FIGS. 17A and 17B. Since some portions of seams 64 may be sealed by the overlying portions of work-function layer 68, the corresponding portions of seam-filling layer 66 may have their top surfaces underlying and spaced apart from the top surface of work-function layer 68, as schematically shown in FIG. 17B. Other portions of seam-filling layer 66 may have their top surfaces exposed.

For a part of gate electrode to act as a work function layer, the part of the gate electrode needs to be within a certain distance (such as within around 3 nm) from the channel of the transistor. The parts of the gate electrode that are too far away from the channel have too-little effect on the work function, and hence are not work-function layers of the transistor. In accordance with some embodiments, the top part of work-function layer 68 is greater than the required distance, and hence the seam-filling layer 66 does not affect the work function, and is not part of the work-function layer of the transistor. In accordance with alternative embodiments, work-function layer 68 is thin, and hence a bottom portion of the seam-filling layer 66 is also a part of the work function layer. Dash lines 71 (FIG. 17B) are illustrated schematically to represent the possible positions of the top of the effective work function layer of the transistor.

Figure 17D:
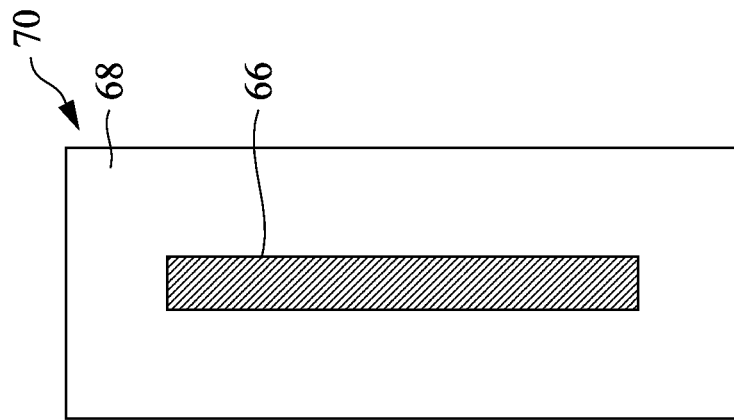
Figure 17C:
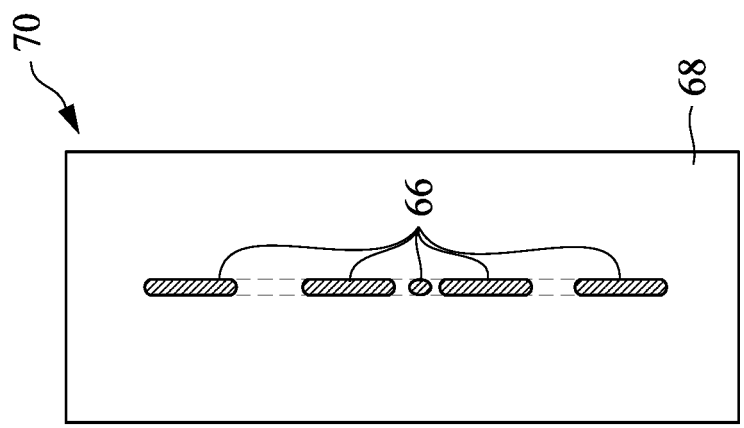

FIG. 17C illustrates a top view of gate stack 70 in accordance with some embodiments. Since the formation of seam 64 (FIGS. 14A and 14B) is random, the shape, the position, and the size of resulting seam-filling layer 66 are random. In accordance with some embodiments, as shown in FIG. 17C, some portions of seam-filling layer 66 in a first gate stack are embedded in work-function layer 68, and are covered by work-function layer 68. Accordingly, these portions of seam-filling layer 66 are shown with dashed lines since these portions are not visible. In a second gate stack in the same device die, seam-filling layer 66 does not extend into the regions marked with dashed lines. Accordingly, in the second gate stack, seam-filling layer 66 includes discrete portions that are separated by work-function layer 68.

FIG. 17D illustrates a top view of gate stack 70 in accordance with alternative embodiments. In the top view, seam-filling layer 66, which may comprise silicon, TiSiN, TaSiN, TiAlSi, WSiCN, or the like, is a continuous elongated strip encircled by work-function layer 68. The embodiments in FIG. 17D may also occur in a third gate stack, which is in the same device die as the first gate stack and the second gate stack discussed in the preceding paragraph.

Figure 18B:
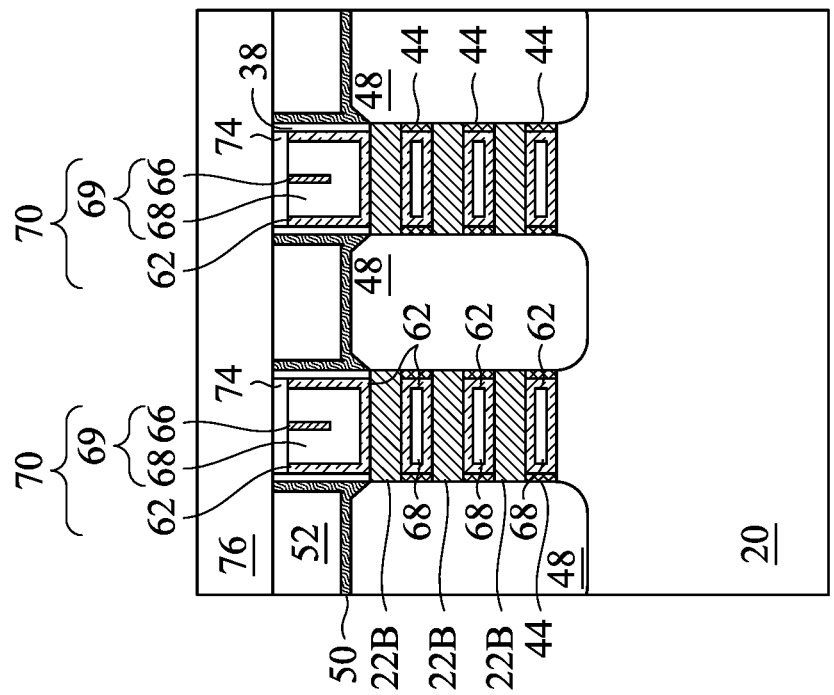
Figure 18A:
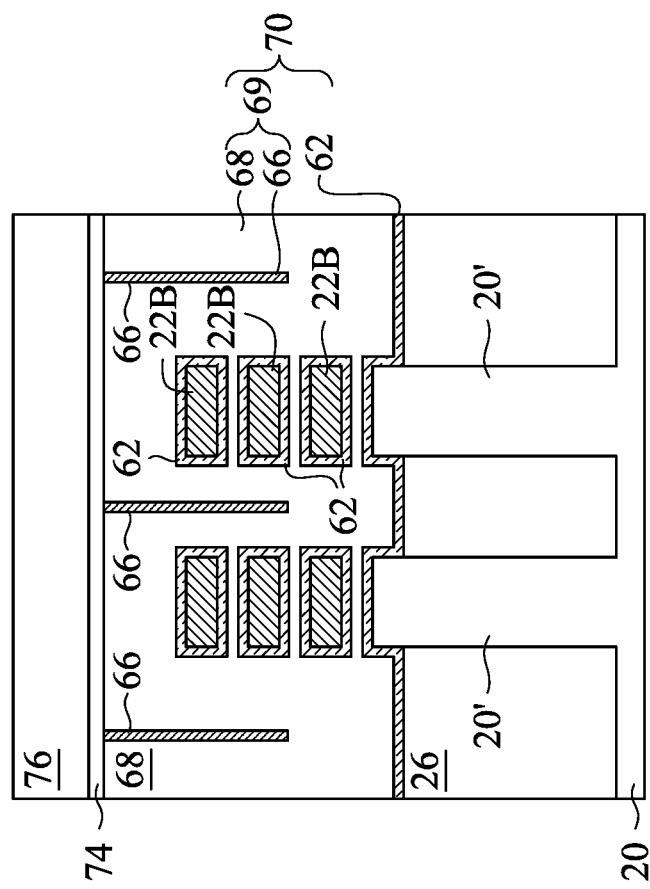
Figure 18C:
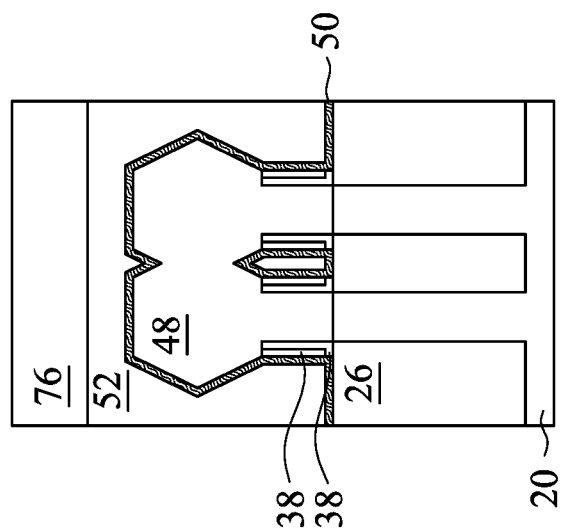

In the processes shown in FIGS. 18A, 18B, and 18C, gate stacks 70 are recessed, so that recesses are formed directly over gate stacks 70 and between opposing portions of gate spacers 38. Gate masks 74 comprising one or more layers of dielectric material, such as silicon nitride, silicon oxynitride, or the like, are filled in each of the recesses, followed by a planarization process to remove excess portions of the dielectric material extending over ILD 52. The respective process is illustrated as process 234 in the process flow 200 shown in FIG. 21. The top views of the gate stack 70 as shown in FIGS. 18A and 18B is not shown, and may be essentially the same to what are shown in FIG. 17C or 17D. For example, some portions of seam-filling layer 66 may have their tops extend to gate masks 74, while some other portions of seam-filling layer 66 may have their tops below and separated from the overlying gate masks 74 by some portions of work-function layer 68.

As further illustrated by FIGS. 18A, 18B, and 18C, ILD 76 is deposited over ILD 52 and over gate masks 74. The respective process is illustrated as process 236 in the process flow 200 shown in FIG. 21. An etch stop layer (not shown), may be, or may not be, deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figure 19B:
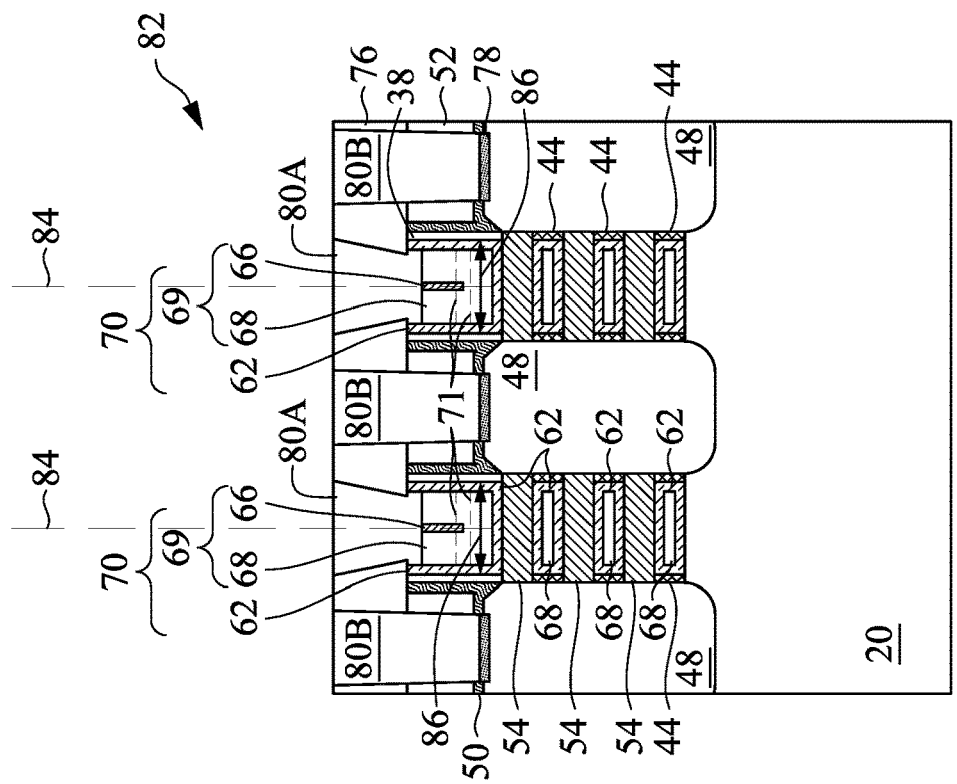
Figure 19A:
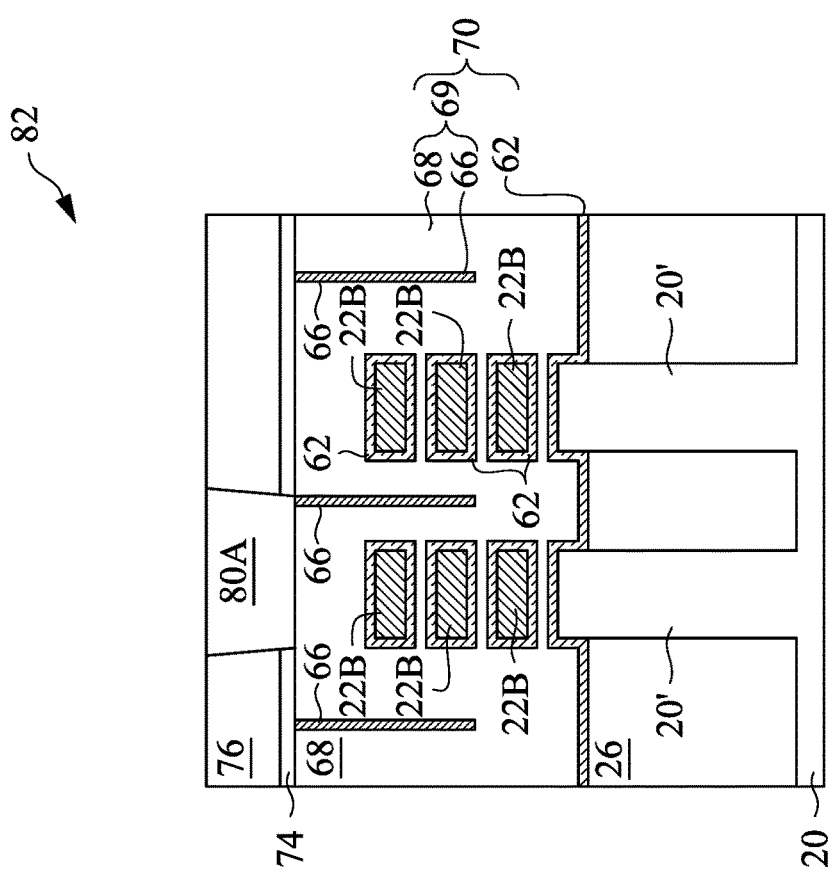
Figure 19C:
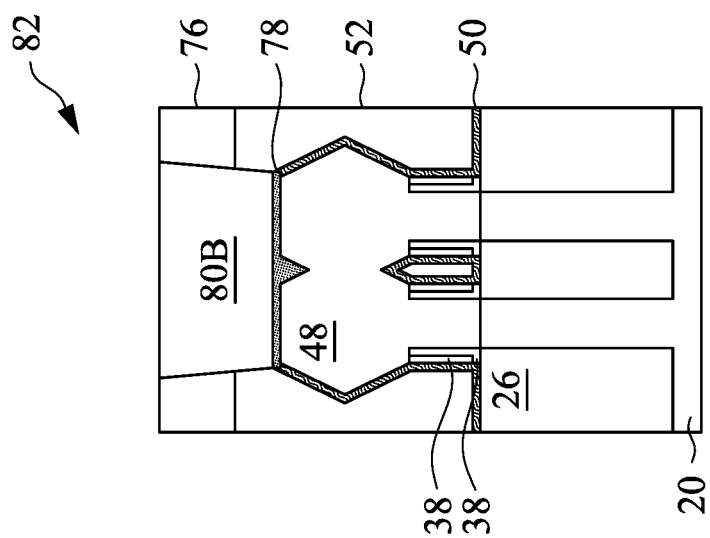

In FIGS. 19A, 19B, and 19C, ILD 76, ILD 52, CESL 50, and gate masks 74 are etched to form recesses (occupied by contact plugs 80A and 80B) exposing surfaces of the epitaxial source/drain regions 48 and/or gate stacks 70. The recesses may be formed through etching using an anisotropic etching process, such as RIE, NBE, or the like. In accordance with some embodiments, the recesses may be formed by etching-through ILD 76 and ILD 52 using a first etching process, etching-through gate masks 74 using a second etching process, and etching-through CESL 50 possibly using a third etching process. Although FIG. 19B illustrates that contact plugs 80A and 80B are in a same cross-section, in various embodiments, contact plugs 80A and 80B may be formed in different cross-sections, thereby reducing the risk of shorting with each other.

After the recesses are formed, silicide regions 78 (FIGS. 19B and 19C) are formed over the epitaxial source/drain regions 48. The respective process is illustrated as process 238 in the process flow 200 shown in FIG. 21. In accordance with some embodiments, silicide regions 78 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal anneal process to form silicide regions 78. The metal may include nickel, cobalt, titanium, tantalum, platinum, tungsten, or the like. The un-reacted portions of the deposited metal are then removed, for example, by an etching process.

Contact plugs 80B are then formed over silicide regions 78. Also, contacts 80A (may also be referred to as gate contact plugs) are also formed in the recesses, and are over and contacting work-function layer 68 and seam-filling layer 66. The respective processes are illustrated as process 240 in the process flow 200 shown in FIG. 21. There may be, or may not be, some portions of seam-filling layer 66 that have top surfaces spaced apart from contacts 80A by portions of work-function layer 68. Contact plugs 80A and 80B may each comprise one or more layers, such as a barrier layer, a diffusion layer, and a filling material. For example, in accordance with some embodiments, contact plugs 80A and 80B each includes a barrier layer and a conductive material, and are electrically coupled to the underlying conductive feature (for example, gate stacks 70 or silicide region 78 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 76. Nano-FET 82 is thus formed.

It is appreciated that a gate contact plug 80A may contact a part, but not all, of the corresponding gate stack 70. Therefore, the cross-sectional view shown in FIG. 19B illustrates the cross-section of a first portion of the gate stack 70. A second portion of the same gate stack 70, on the other hand, may have the cross-sectional view same as what is shown in FIG. 18B, wherein gate mask 74 still remains.

Figure 20:
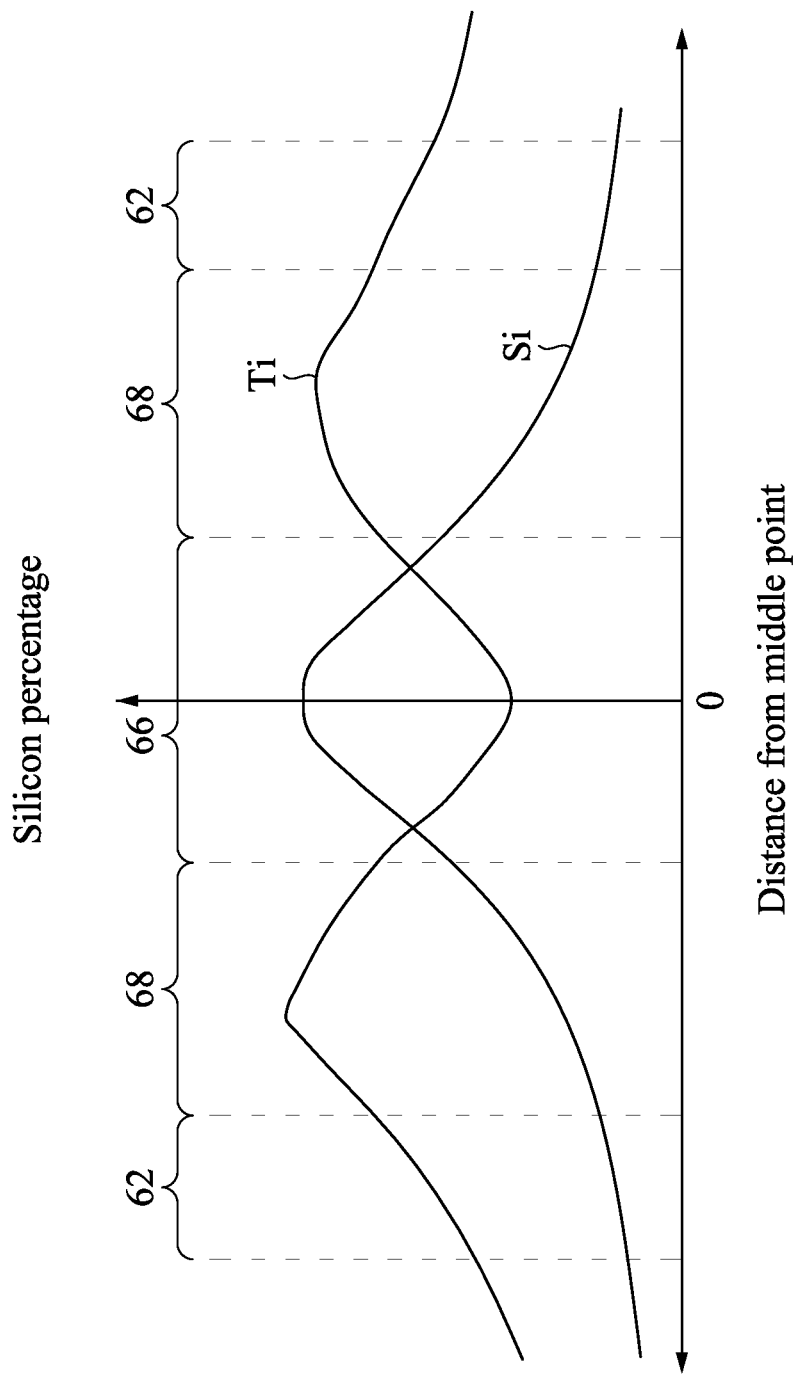
FIG. 20 illustrates the silicon atomic percentage and titanium atomic percentage in a gate stack as a function of the distance from a middle point of the gate stack in accordance with some embodiments.

FIG. 20 illustrates the silicon atomic percentage and titanium atomic percentage in gate stacks 70 (FIG. 19B) as functions of distance from a middle line of the gate stack. The X-axis represents the distance from the middle line 84 (FIG. 19B) in a gate stack 70. The X-axis value of 0 represents the position of the middle line 84 as in FIG. 19B. The silicon atomic percentages and titanium atomic percentages are measured along arrows 86 in FIG. 19B. In accordance with some embodiments, at the middle line 84, the silicon atomic percentage has a peak value, and the silicon atomic percentage gradually and continuously reduce when the distance increases. In accordance with some embodiments, the silicon in gate stack 70 is elemental (that does not form a compound with other elements in gate stack 70). In accordance with alternative embodiments, the silicon in gate stack 70 is a part of a compound, for example, as a part of TiAlSi, TiSiN, TaSiN, or the like.

As also shown in FIG. 20, the titanium atomic percentage has peak values in work-function layer 68, and the titanium atomic percentage reduces in seam-filling layer 66 and gate dielectric layer 62.

The embodiments of the present disclosure have some advantageous features. By forming a seam-filling layer to fill the seams in work-function layers, the seams in the resulting gate electrodes are filled, and the problems occurring due to the seams are avoided. By adopting silicon soaking or amorphous structure for the seam-filling layer, the seam-filling layer is able to fill small seams.

In accordance with some embodiments of the present disclosure, a method comprises forming a dummy gate stack over a semiconductor region; forming epitaxial source/drain regions on opposite sides of the dummy gate stack; removing the dummy gate stack to form a trench; depositing a gate dielectric layer extending into the trench; depositing a work-function layer over the gate dielectric layer, wherein the work-function layer comprises a seam therein; depositing a silicon-containing layer to fill the seam; and performing a planarization process to remove excess portions of the silicon-containing layer, the work-function layer, and the gate dielectric layer, with remaining portions of the silicon-containing layer, the work-function layer, and the gate dielectric layer forming a gate stack. In an embodiment, the depositing the silicon-containing layer comprises soaking a corresponding wafer comprising the work-function layer in a silicon-containing process gas. In an embodiment, the silicon-containing layer comprises a silicon layer. In an embodiment, the depositing the silicon-containing layer comprises depositing a compound layer comprising silicon and a metal. In an embodiment, the metal is selected from titanium, tantalum, and aluminum. In an embodiment, between the depositing the silicon-containing layer and the planarization process, no additional conductive layer is deposited over the silicon-containing layer. In an embodiment, the depositing the work-function layer comprises depositing a titanium-and-silicon containing layer. In an embodiment, the depositing the work-function layer is performed through atomic layer deposition, with opposing portions of work-function layer growing toward each other during the depositing. In an embodiment, at a time the depositing the silicon-containing layer is started, some portions of the seam are sealed by the work-function layer, and in a top view of the work-function layer, the seam is separated as discrete portions. In an embodiment, in a top view of the work-function layer, at least a portion of the seam covered by the work-function layer interconnects two of the discrete-and-visible portions of the seam.

In accordance with some embodiments of the present disclosure, an integrated circuit structure comprises a semiconductor region; a source/drain region on a side of the semiconductor region; and a gate stack over the semiconductor region, the gate stack comprising a gate dielectric; a work-function layer over the gate dielectric, wherein the work-function layer comprises a bottom portion over the gate dielectric; a first sidewall portion and a second sidewall portion over and connecting to opposite ends of the bottom portion; and a silicon-containing layer comprising a first sidewall contacting the first sidewall portion; and a second sidewall contacting the second sidewall portion. In an embodiment, the work-function layer comprises a top surface, and the silicon-containing layer comprises a first portion that extends to a height of the top surface; and a second portion fully embedded in the work-function layer. In an embodiment, the silicon-containing layer comprises elemental silicon. In an embodiment, the silicon-containing layer comprises silicon as a part of a compound. In an embodiment, silicon in the gate stack has a peak atomic percentage at middle of the gate stack. In an embodiment, the silicon-containing layer comprises TiSiN.

In accordance with some embodiments of the present disclosure, an integrated circuit structure comprises a semiconductor region; a first gate spacer and a second gate spacer over the semiconductor region; and a gate stack over the semiconductor region and between the first gate spacer and the second gate spacer, the gate stack comprising a silicon-containing layer that extends to a middle line between the first gate spacer and the second gate spacer, and wherein the silicon-containing layer has a peak silicon concentration at the middle line, and silicon concentrations in the gate stack gradually decrease in regions away from the middle line. In an embodiment, the gate stack further comprises a work-function layer, wherein opposite sidewalls of the silicon-containing layer are in contact with additional sidewalls of the work-function layer. In an embodiment, the integrated circuit structure further comprises a dielectric gate mask over and contacting the gate stack, wherein the silicon-containing layer comprises a first portion having a first top surface in physical contacting the dielectric gate mask; and a second portion having a second top surface spaced apart from the dielectric gate mask by a portion of the work-function layer. In an embodiment, the silicon-containing layer comprises elemental silicon.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a dummy gate stack over a semiconductor region;
    forming epitaxial source/drain regions on opposite sides of the dummy gate stack;
    removing the dummy gate stack to form a trench;
    depositing a gate dielectric layer extending into the trench;
    depositing a work-function layer over the gate dielectric layer, wherein the work-function layer comprises a seam therein;
    depositing a silicon-containing layer to fill the seam, wherein at a time the depositing the silicon-containing layer is started, some portions of the seam are sealed by the work-function layer, and in a top view of the work-function layer, the seam is separated as discrete portions; and
    performing a planarization process to remove excess portions of the silicon-containing layer, the work-function layer, and the gate dielectric layer, with remaining portions of the silicon-containing layer, the work-function layer, and the gate dielectric layer forming a gate stack.

2. The method of claim 1, wherein the depositing the silicon-containing layer comprises soaking a wafer comprising the work-function layer in a silicon-containing process gas.

3. The method of claim 1, wherein the silicon-containing layer comprises a silicon layer.

4. The method of claim 1, wherein the depositing the silicon-containing layer comprises depositing a compound layer comprising silicon and a metal.

5. The method of claim 4, wherein the metal is selected from the group consisting of titanium, tantalum, and aluminum.

6. The method of claim 1, wherein between the depositing the silicon-containing layer and the planarization process, no additional conductive layer is deposited over the silicon-containing layer.

7. The method of claim 1, wherein the depositing the work-function layer comprises depositing a titanium-and-silicon containing layer.

8. The method of claim 1, wherein the depositing the work-function layer is performed through atomic layer deposition, with opposing portions of the work-function layer growing toward each other during the depositing.

9. The method of claim 1, wherein in a top view of the work-function layer, at least a portion of the seam is directly underlying a portion of the work-function layer.

10. A method comprising:
forming a source/drain region on a side of a semiconductor region; and
forming a gate stack over the semiconductor region, the forming the gate stack comprising:
forming a gate dielectric;
forming a work-function layer over the gate dielectric, wherein the work-function layer comprises:
a bottom portion over the gate dielectric;
a first sidewall portion and a second sidewall portion over and connecting to opposite ends of the bottom portion, wherein the first sidewall portion and the second sidewall portion grow toward each other and merge with each other at a point; and
after the first sidewall portion and the second sidewall portion are merged, filling a silicon-containing layer into the work-function layer, the silicon-containing layer comprising:
a first sidewall contacting the first sidewall portion; and
a second sidewall contacting the second sidewall portion.

11. The method of claim 10, wherein the work-function layer comprises a first top surface, and the silicon-containing layer comprises:
a first portion comprising a second top surface coplanar with the first top surface; and
a second portion fully embedded in the work-function layer.

12. The method of claim 10, wherein the silicon-containing layer comprises elemental silicon that is formed through soaking.

13. The method of claim 10, wherein the silicon-containing layer comprises silicon as a part of a compound.

14. The method of claim 10, wherein the silicon-containing layer has a peak silicon atomic percentage at middle of the gate stack.

15. The method of claim 10, wherein the silicon-containing layer comprises TiSiN.

16. A method comprising:
forming a first gate spacer and a second gate spacer over a semiconductor region; and
forming a gate stack over the semiconductor region and between the first gate spacer and the second gate spacer, the forming the gate stack comprising:
forming a conductive layer; and
filling a silicon-containing layer into the conductive layer, wherein in a top view of the conductive layer, the silicon-containing layer is separated by the conductive layer into a first portion and a second portion, wherein the silicon-containing layer extends to a middle line between the first gate spacer and the second gate spacer, and wherein the silicon-containing layer has a higher silicon concentration than the conductive layer.

17. The method of claim 16, wherein the conductive layer comprises a work-function layer, and wherein opposite sidewalls of the silicon-containing layer are in contact with sidewalls of the work-function layer.

18. The method of claim 17 further comprising forming a dielectric gate mask over and contacting the gate stack, wherein the silicon-containing layer comprises:
a first portion having a first top surface in physical contact with the dielectric gate mask; and
a second portion having a second top surface spaced apart from the dielectric gate mask by a portion of the work-function layer.

19. The method of claim 16, wherein the silicon-containing layer is formed by soaking a respective wafer comprising the conductive layer in a silicon-containing gas.

* * * * *